US009479715B2

United States Patent
Oike

(10) Patent No.: US 9,479,715 B2
(45) Date of Patent: *Oct. 25, 2016

(54) SOLID-STATE IMAGING DEVICE, METHOD OF DRIVING THE SAME, AND ELECTRONIC SYSTEM INCLUDING THE DEVICE

(71) Applicant: Sony Corporation, Tokyo (JP)

(72) Inventor: Yusuke Oike, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/728,002

(22) Filed: Jun. 2, 2015

(65) Prior Publication Data

US 2015/0264282 A1 Sep. 17, 2015

Related U.S. Application Data

(63) Continuation of application No. 14/471,035, filed on Aug. 28, 2014, now Pat. No. 9,071,780, which is a continuation of application No. 12/781,074, filed on May 17, 2010, now Pat. No. 8,854,518.

(30) Foreign Application Priority Data

Jun. 5, 2009 (JP) .................................. 2009-135666

(51) Int. Cl.
*H04N 5/355* (2011.01)
*H04N 5/363* (2011.01)
*H04N 5/359* (2011.01)
(Continued)

(52) U.S. Cl.
CPC .... *H04N 5/35527* (2013.01); *H01L 27/14609* (2013.01); *H04N 5/3597* (2013.01); *H04N 5/363* (2013.01); *H04N 5/3741* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 6,420,738 B1 * | 7/2002 | Kimura | ............. H01L 27/14812 257/223 |
| 6,706,550 B2 * | 3/2004 | Lee | ................... H01L 27/14603 257/233 |

(Continued)

FOREIGN PATENT DOCUMENTS

| | | |
|---|---|---|
| EP | 1117249 | 7/2001 |
| JP | HEI 06-245144 | 9/1994 |

(Continued)

OTHER PUBLICATIONS

Korean Patent Office Action corresponding to KR Serial No. 10-2010-0048450 dated Feb. 29, 2016.

*Primary Examiner* — Mark Monk
(74) *Attorney, Agent, or Firm* — Dentons US LLP

(57) ABSTRACT

A solid-state imaging device including a unit pixel including a photoelectric conversion section, an impurity-diffusion region capable of temporarily accumulating or holding electric charges generated by the photoelectric conversion section, and a reset transistor resetting the impurity-diffusion region by a voltage of a voltage-supply line, and having an impurity concentration such that at least the reset transistor side of the impurity-diffusion region becomes a depletion state; and a drive circuit changing the voltage of the voltage-supply line from a first voltage lower than a depletion potential of the reset transistor side of the impurity-diffusion region to a second voltage higher than the depletion potential while the reset transistor is on.

10 Claims, 27 Drawing Sheets

(51) Int. Cl.
*H04N 5/374* (2011.01)
*H01L 27/146* (2006.01)

(56) References Cited

U.S. PATENT DOCUMENTS

| | | |
|---|---|---|
| 7,391,066 B2 | 6/2008 | Rhodes |
| 2006/0219868 A1* | 10/2006 | Morimoto ......... H01L 27/14609 250/208.1 |
| 2007/0057158 A1 | 3/2007 | Hong |
| 2008/0088726 A1* | 4/2008 | Tsukimura ............. H04N 5/335 348/308 |
| 2008/0153193 A1* | 6/2008 | Lyu ................... H01L 27/14603 438/59 |

FOREIGN PATENT DOCUMENTS

| | | |
|---|---|---|
| JP | 2001-309243 | 11/2001 |
| JP | 2007-068099 | 3/2007 |
| JP | 2007-074435 | 3/2007 |
| WO | WO/01/58144 | 8/2001 |
| WO | WO/2009/020316 | 2/2009 |

\* cited by examiner

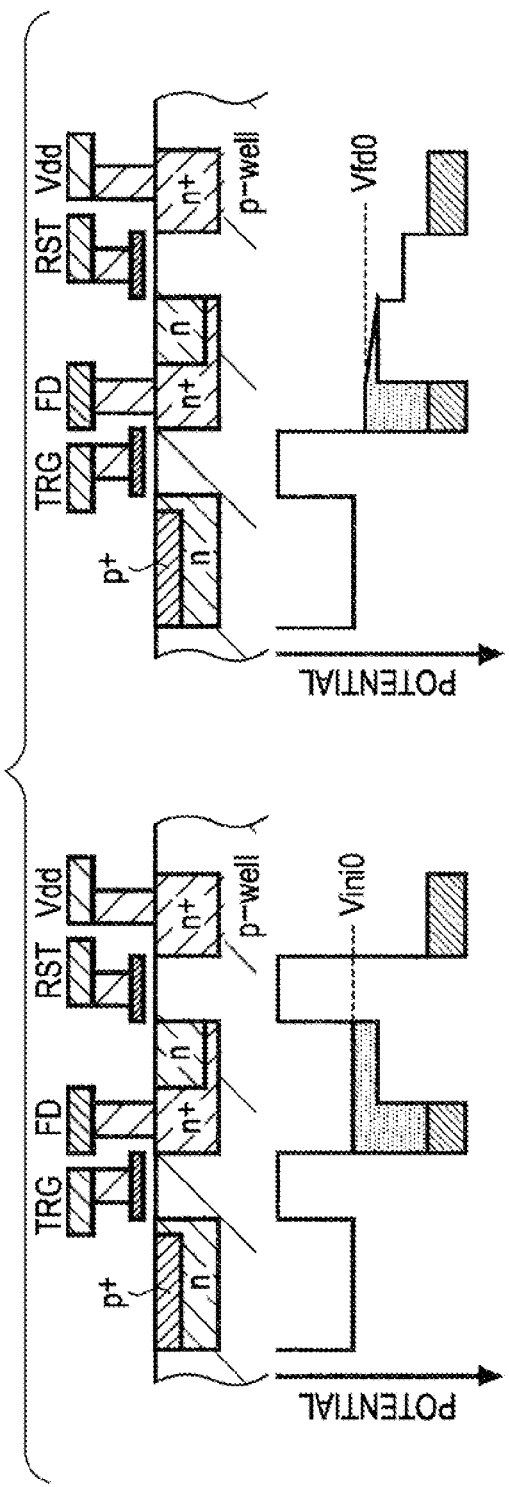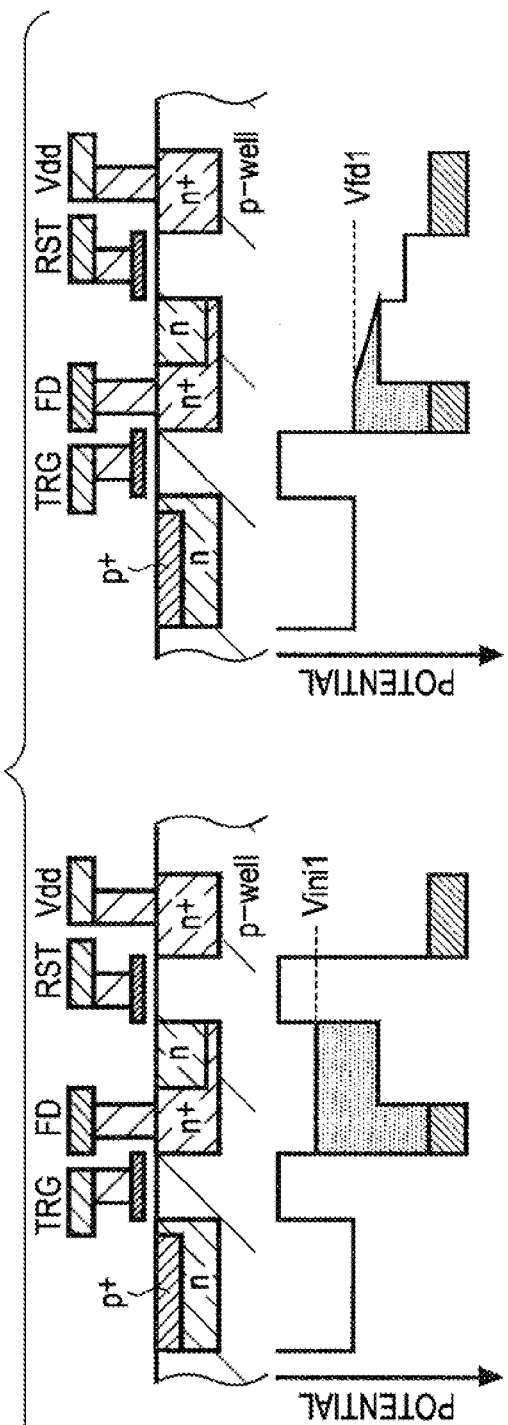

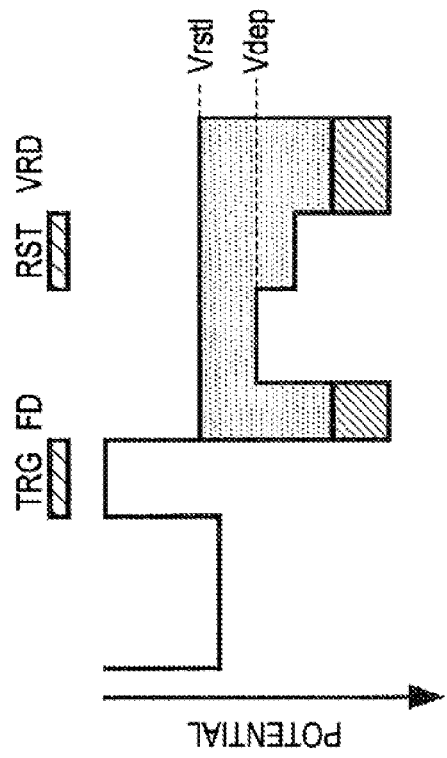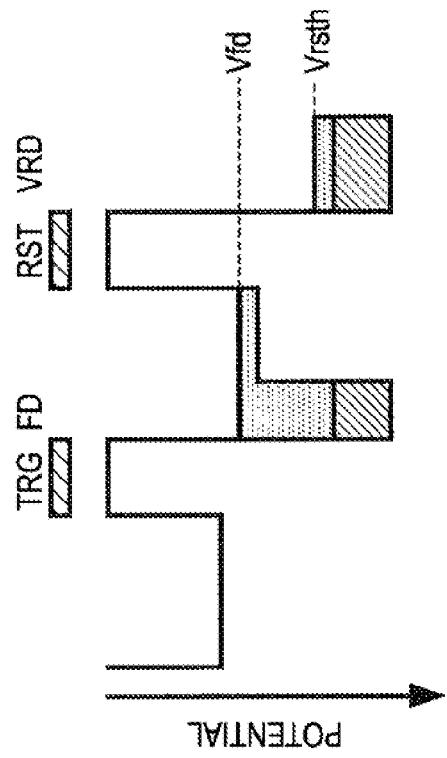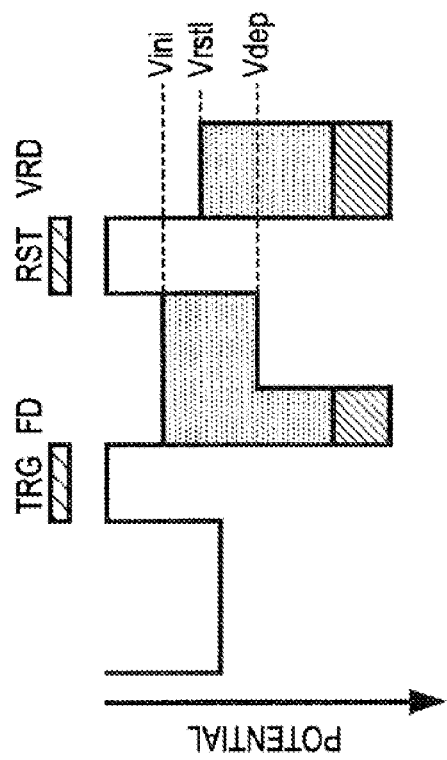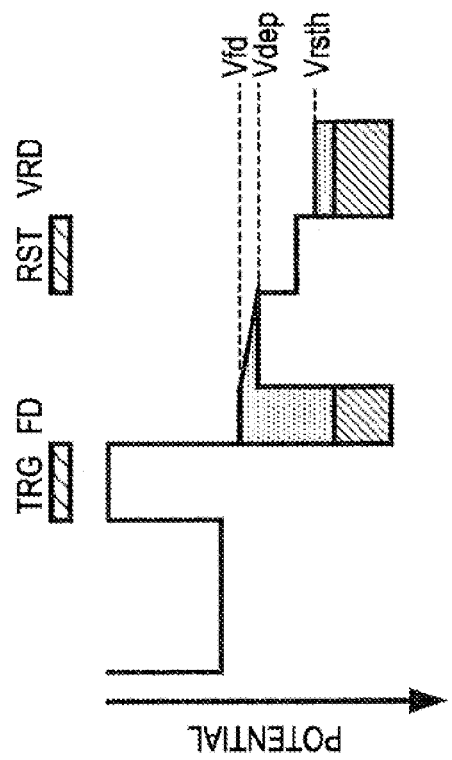

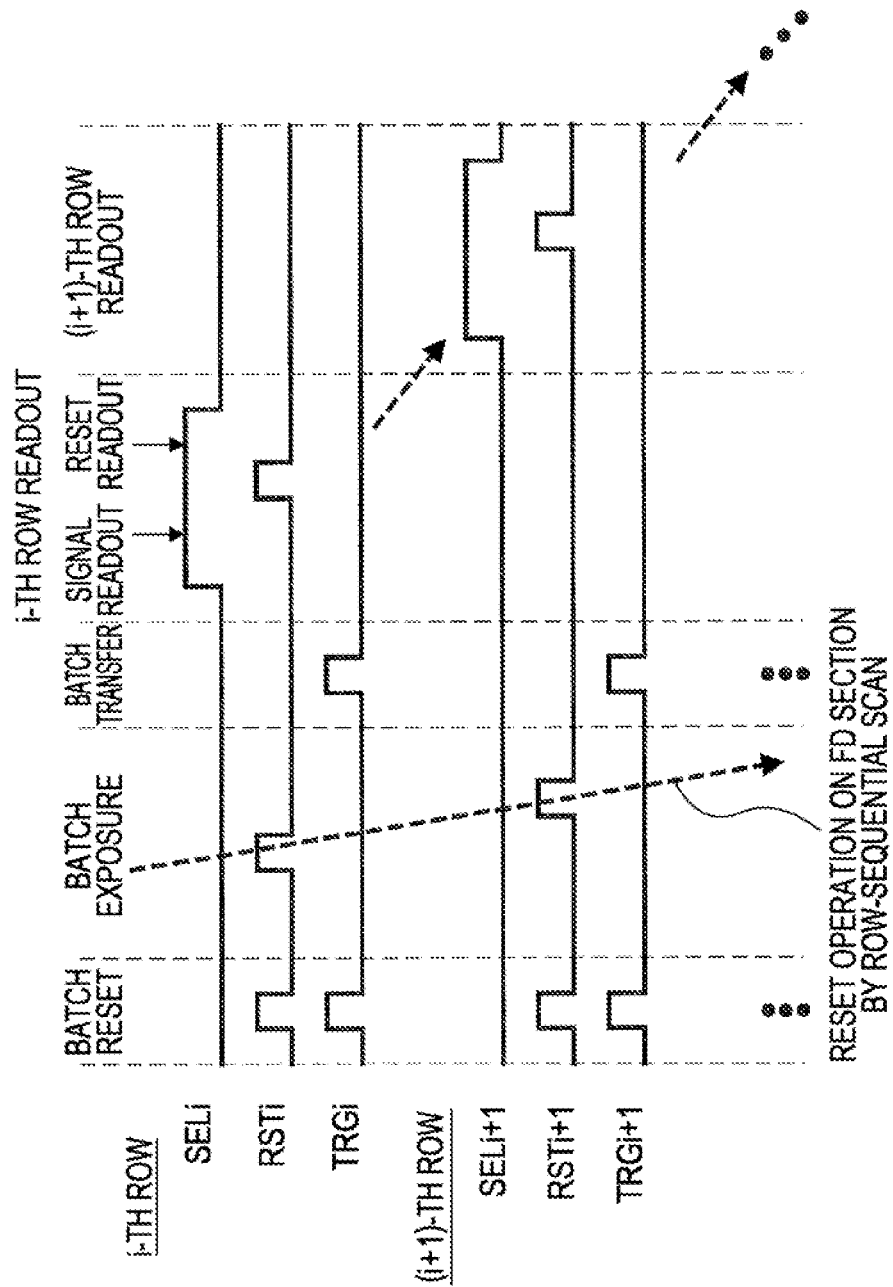

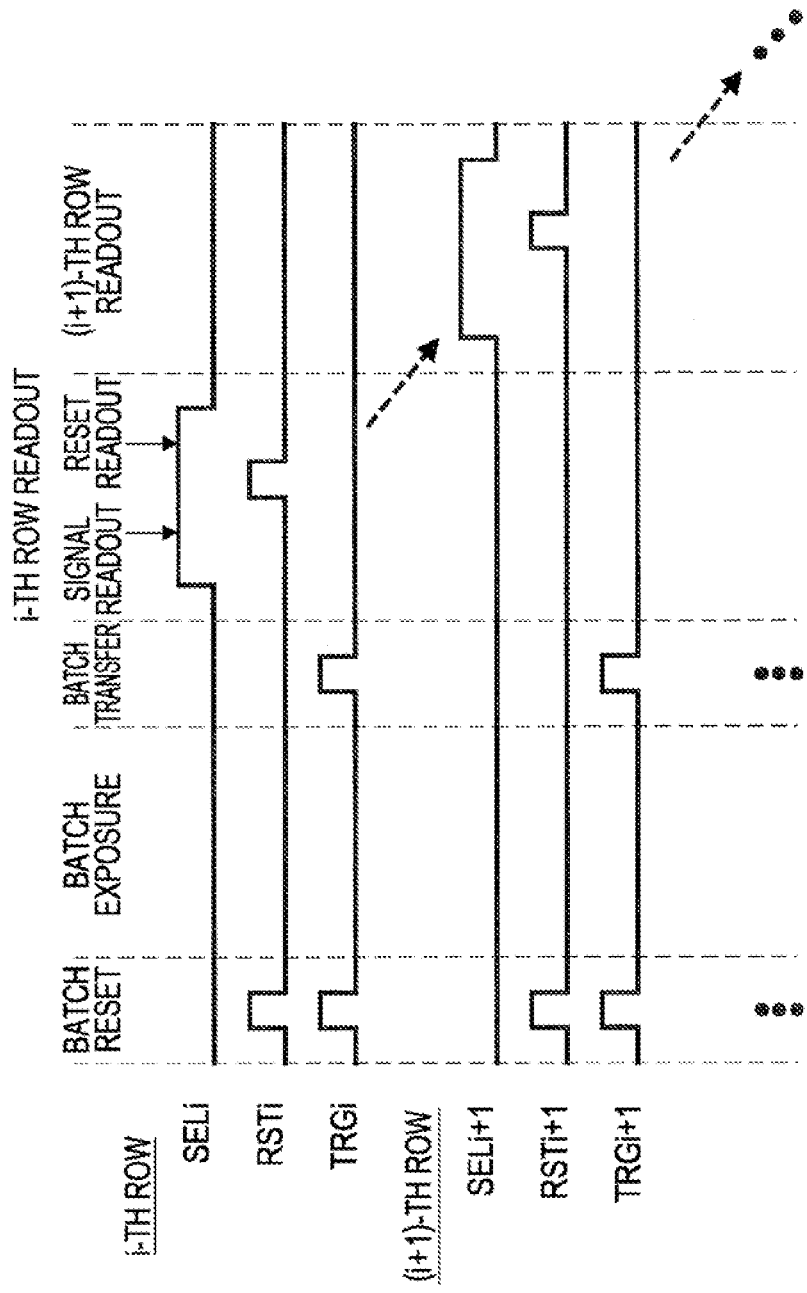

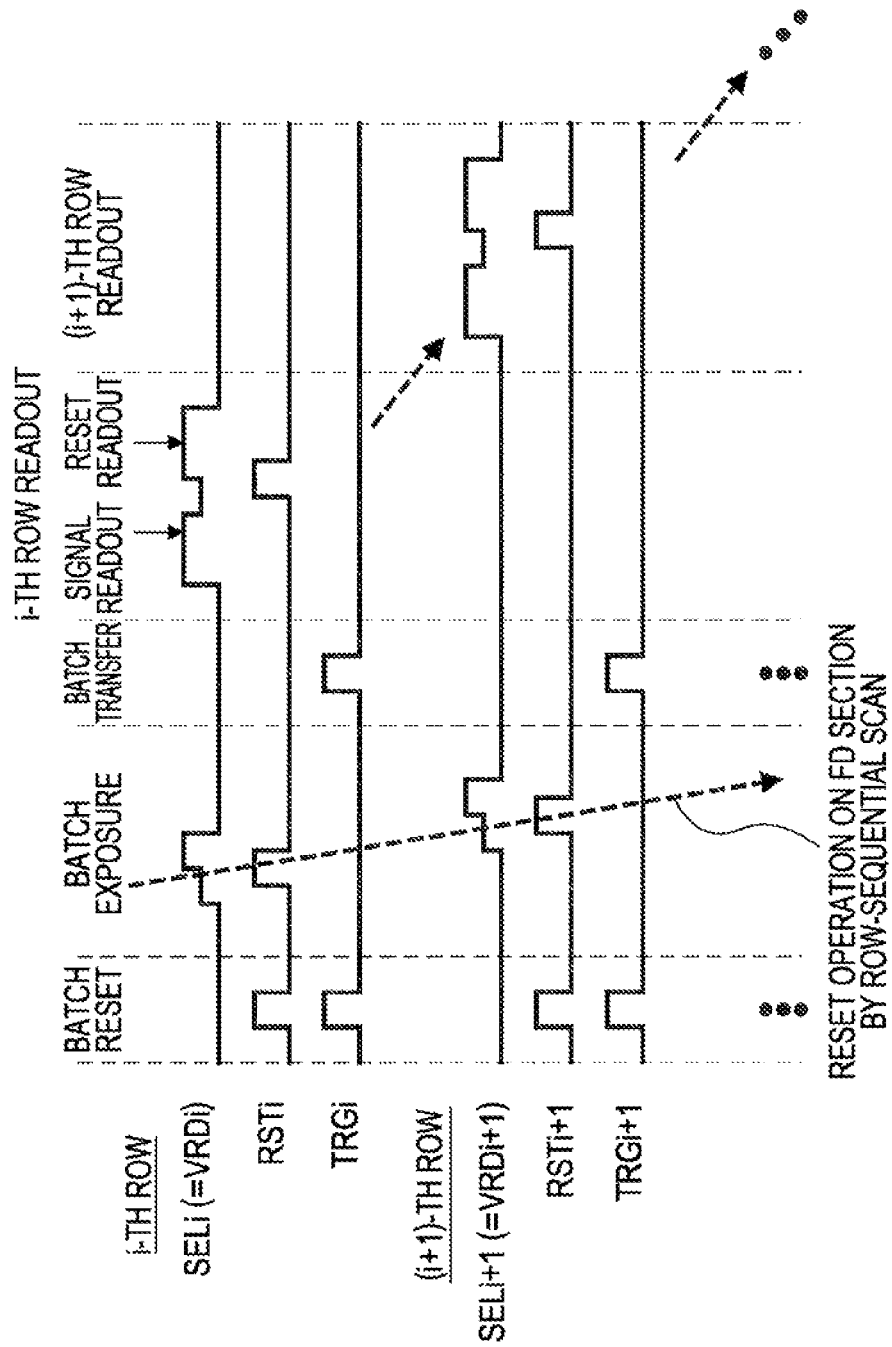

SOLID-STATE IMAGING DEVICE, METHOD OF DRIVING THE SAME, AND ELECTRONIC SYSTEM INCLUDING THE DEVICE

RELATED APPLICATION DATA

This application is a continuation of U.S. patent application Ser. No. 14/471,035 filed Aug. 28, 2014, which is a continuation of U.S. patent application Ser. No. 12/781,074 filed May 17, 2010, now U.S. Pat. No. 8,854,518 issued Oct. 7, 2014, the entireties of all of which are incorporated herein by reference to the extent permitted by law. The present application claims the benefit of priority to Japanese Patent Application No. JP 2009-135666 filed on Jun. 5, 2009 in the Japan Patent Office, the entirety of which is incorporated by reference herein to the extent permitted by law.

BACKGROUND OF THE INVENTION

1. Field of the Invention

The present invention relates to solid-state imaging devices, methods of driving the solid-state imaging devices, and electronic systems.

2. Description of the Related Art

In a general solid-state imaging device, when electric charges generated by photoelectric conversion are read, the charges are accumulated in an impurity-diffusion region called a floating-diffusion region, or the charges are transferred from a light receiving section to the impurity-diffusion region so that the charges are converted into a voltage in that impurity-diffusion region. A pixel in such a kind of solid-state imaging device generally has a configuration including a reset transistor which resets the floating-diffusion region (hereinafter referred to as an "FD section") to have a predetermined potential.

In a pixel configuration having a reset transistor, the reset transistor is set to be an on state, and the FD section is initialized to have a fixed voltage Vdd. After that, the reset transistor is changed to an off state to change the FD section to a floating state. The electric charges are stored or transferred to the initialized FD section so that the output voltage produced by charge/voltage conversion in the FD section is obtained. In the reset operation, it is noted that roughly two kinds of noise occur when sampling the initialization voltage of the voltage Vdd in the floating state.

One of the two kinds of noise is a thermal noise (kTC noise), which is dependent on a capacitance of the FD section, and is generated randomly for each reset operation. The other one is noise generated by voltage fluctuations caused by a resistance component of a wiring line at the time of thermal noise and current consumption of the voltage Vdd. Depending on timing of the reset operation, different values are sampled. For the two kinds of noise, it is noted that in a general CMOS-image-sensor operation, noise can be eliminated substantially completely by a noise elimination method called correlated double sampling.

In the correlated-double-sampling processing, a voltage Vo_rst of an FD section, sampled by the reset operation is read, and immediately after that, a stored charge is transferred from a light receiving section to the FD section to be read as a signal voltage Vo_sig. Here, noise by the reset operation is held in the FD section, and thus same noise is overlaid on Vo_rst and Vo_sig. Accordingly, by calculating Vo_sig−Vo_rst, it is possible to obtain an output of the stored charge from which noise caused by a reset operation has been eliminated.

FIG. 28 is a timing waveform chart in the case of an example of driving in which noise is eliminated by correlated double sampling. FIG. 28 shows a selection pulse SEL, which selects a pixel, a reset pulse RST, which resets the FD section, and a transfer pulse TRG and a voltage of the FD section (hereinafter sometimes referred to simply as an "FD voltage"), which reads out a signal charge from a light receiving section to the FD section.

In the case of the example of driving, a signal charge is held by the light receiving section. At the time of readout operation, first, the reset pulse RST becomes active so that a voltage of the FD section is set to a reset voltage Vdd. When the reset pulse RST is active, the voltage of the FD section randomly fluctuates by the fluctuations of the voltage Vdd and thermal noise. The value at the moment when the reset pulse RST has become inactive is fixed as a voltage of the FD section.

At this time, assuming that the fixed noise is $\Delta Vn$, the voltage of the FD section becomes $Vdd+\Delta Vn$. The voltage $Vdd+\Delta Vn$ is read out as a reset level Vo_rst, and then the transfer pulse TRG becomes active so that the signal charge of the light receiving section is transferred to the FD section. The FD section is floating, and thus a voltage Vsig for the signal charge is added to the above-described reset level $Vdd+\Delta Vn$, resulting in $Vdd+\Delta Vn+Vsig$.

The voltage of the FD section at this time $Vdd+\Delta Vn+Vsig$ is read out as a signal level Vo_sig. The difference with the above-described reset level Vo_rst ($=Vdd+\Delta Vn$) is obtained, and a final output Vout becomes as follows, thereby canceling the reset noise $\Delta Vn$.

$$Vout = (Vdd + \Delta Vn + Vsig) - (Vdd + \Delta Vn)$$
$$= Vsig$$

However, readout noise other than the reset noise Vo_rst, for example, a so-called 1/f noise, which occurs in an output circuit (an amplification transistor of a source follower circuit, etc.,), is noticeable in a low-frequency band. Accordingly, for reading out of the reset level Vo_rst, if not executed immediately before the readout of the signal level Vo_sig, noise of a low-frequency band is overlaid on the output, and thus it is difficult to obtain advantages of correlated double sampling, thereby resulting in image-quality deterioration.

For this reason, in a solid-state imaging device performing global exposure operation (batch exposure) in which all the pixels are subjected to photoelectric conversion in a same exposure period, a drive method in which after the signal level is read out, the reset operation is performed again to read out the reset level (for example, refer to Japanese Unexamined Patent Application Publication No. 2007-074435). By the global exposure, photoelectric conversion is performed for all the pixels in a same exposure period so that an image without deformation can be obtained from a subject with motion.

Such a drive method is employed in an image sensor accumulating photo-converted electric charges in the FD section directly, for example a solid-state imaging device using an organic photoelectric conversion layer as a light receiving section in addition to a solid-state imaging device performing global exposure operation.

Specifically, in the case of reading out in a state in which the signal charge is held by the FD section, or the signal charge is stored in the FD section, the order of driving becomes the order as shown in FIG. 29. That is to say, after the signal level is read out, a reset operation is performed to obtain the reset level.

To describe more in detail, first, the FD section is reset before the signal charge is transferred to the FD section, or the signal charge is stored. At this time, noise ΔVn' is overlaid on the rest voltage Vdd.

Electric charges of all the pixels are transferred simultaneously or are directly stored in the FD section during an exposure period so that a signal charge Vsig is added to the voltage of the FD section. Thus, at the point in time of the readout operation, the signal level is already held as Vdd+ΔVn'+Vsig.

In the readout operation, first, the signal level is read out. After that, the reset operation is performed again to read out the reset level, and the difference between the signal level and the reset level is obtained. In the rest operation, the voltage of the FD section is set to the reset voltage Vdd, the noise is fixed to a noise ΔVn, which is different from the former ΔVn' by random noise.

Accordingly, the reset level becomes Vdd+ΔVn, and the final output Vout becomes as follows.

$$Vout = (Vdd + \Delta Vn' + Vsig) - (Vdd + \Delta Vn)$$
$$= Vsig + (\Delta Vn' - \Delta Vn)$$

That is to say, it is possible to eliminate an offset component, the voltage Vdd, but it is difficult to eliminate random noise, namely the noise ΔVn and the noise ΔVn'. In addition to thermal noise, the reset voltage Vdd fluctuates by the surrounding circuit operations as the power-source noise, and the fluctuations result in image-quality deterioration, such as unevenness on the screen (luminance unevenness on the screen), etc.

SUMMARY OF THE INVENTION

As described above, in the case of employing a drive method in which reset operation is performed to eliminate noise after the signal level is read out, while it is possible to eliminate offset noise occurring fixedly, it is difficult to eliminate noise occurring for each reset operation. For example, it is difficult to eliminate fluctuations of the reset voltage Vdd and thermal noise.

Accordingly, it is desirable to provide a solid-state imaging device, a method of driving the device, and an electronic system capable reducing random noise and unevenness on the screen at reset time in the case of driving to read out the reset level after reading out the signal level, and reducing deterioration of the image quality at the time of reset operation.

According to an embodiment of the present invention, there is provided a solid-state imaging device including: a unit pixel including a photoelectric conversion section, an impurity-diffusion region capable of temporarily accumulating or holding electric charges generated by the photoelectric conversion section, and a reset transistor resetting the impurity-diffusion region by a voltage of a voltage-supply line, and having an impurity concentration such that at least the reset transistor side of the impurity-diffusion region becomes a depletion state; and a drive circuit changing the voltage of the voltage-supply line from a first voltage lower than a depletion potential of the reset transistor side of the impurity-diffusion region to a second voltage higher than the depletion potential while the reset transistor is on.

Here, in "accumulating or holding", "accumulating" means that the electric charges generated during reception of light are directly accumulated in the impurity-diffusion region, and "holding" means that the electric charges generated by photoelectric conversion and stored by the photoelectric conversion section are transferred to the impurity-diffusion region to be held.

In using a drive method in which the reset level is read out after reading out the signal level, it is necessary to have a structure in which at least a part of a reset-transistor side of the impurity-diffusion region has a low impurity concentration in order for the pixel structure of a unit pixel to have a depleted reset-transistor side of the impurity-diffusion region. Thereby, it is possible to reduce random noise and unevenness on the screen (luminance unevenness on the screen) at the time of resetting the impurity-diffusion region.

And during an on period of the reset transistor, the voltage of the voltage supply line, that is to say, the drain voltage of the reset transistor is changed from the first voltage to the second voltage. Thereby, the voltage of the impurity-diffusion region converges to a voltage determined by the depletion potential without being influenced by an initial value of the potential of the impurity-diffusion region. As a result, it is possible to suppress image-quality deterioration caused by residual images of the image-quality deterioration at reset operation time (residual images dependent on the initial state).

By the present invention, in the case of driving in which a reset level is read out after the readout of a signal level, it is possible to reduce random noise and unevenness of the screen at reset time, and to reduce image-quality deterioration at the time of reset operation.

BRIEF DESCRIPTION OF THE DRAWINGS

FIGS. 4A and 4B are explanatory diagrams on problems of pixel structures according to the reference example 1 and the reference example 2, respectively;

FIGS. 8A, 8B, 8C, and 8D are operation explanatory diagrams on an operation example in a pixel structure according to the first embodiment;

FIG. 17 is a timing chart for explaining an example of driving according to a second embodiment;

FIG. 18 is a timing chart for explaining a general example of driving in batch exposure operation;

FIG. 19 is a timing chart for explaining an example of driving in the case where a driving method according to the second embodiment is applied to the pixel structure according to the first embodiment;

FIG. 20A is a plan view of a surrounding area of an FD section, and FIG. 20B is a sectional view taken along line XXB-XXB of FIG. 20A;

FIG. 21A is a circuit diagram of a pixel, and FIG. 21B is a sectional view of the pixel structure;

FIG. 23A is a circuit diagram, and FIG. 23B is a sectional view;

DESCRIPTION OF THE PREFERRED EMBODIMENTS

In the following, detailed descriptions will be given of modes for carrying out the invention (hereinafter referred to as embodiments) with reference to the drawings. In this regard, the descriptions will be given in the following order.

1. Solid-state imaging device to which the present invention is applied
   1.1 System configuration
   1.2 Circuit configuration of unit pixel
   1.3 Pixel structure according to reference examples
2. First embodiment (example in which while reset pulse is active, drain voltage of reset transistor is changed from a voltage lower than depletion potential to a voltage higher than depletion potential)
   2.1 Pixel structure
   2.2 Circuit example
3. Second embodiment (example in which in a batch exposure operation, before performing batch transfer of signal charges to FD section, initialization driving is performed on FD section in row sequence)
4. The other pixel structure examples
5. Variations
6. Electronic systems (imaging apparatuses)

Figure 1:
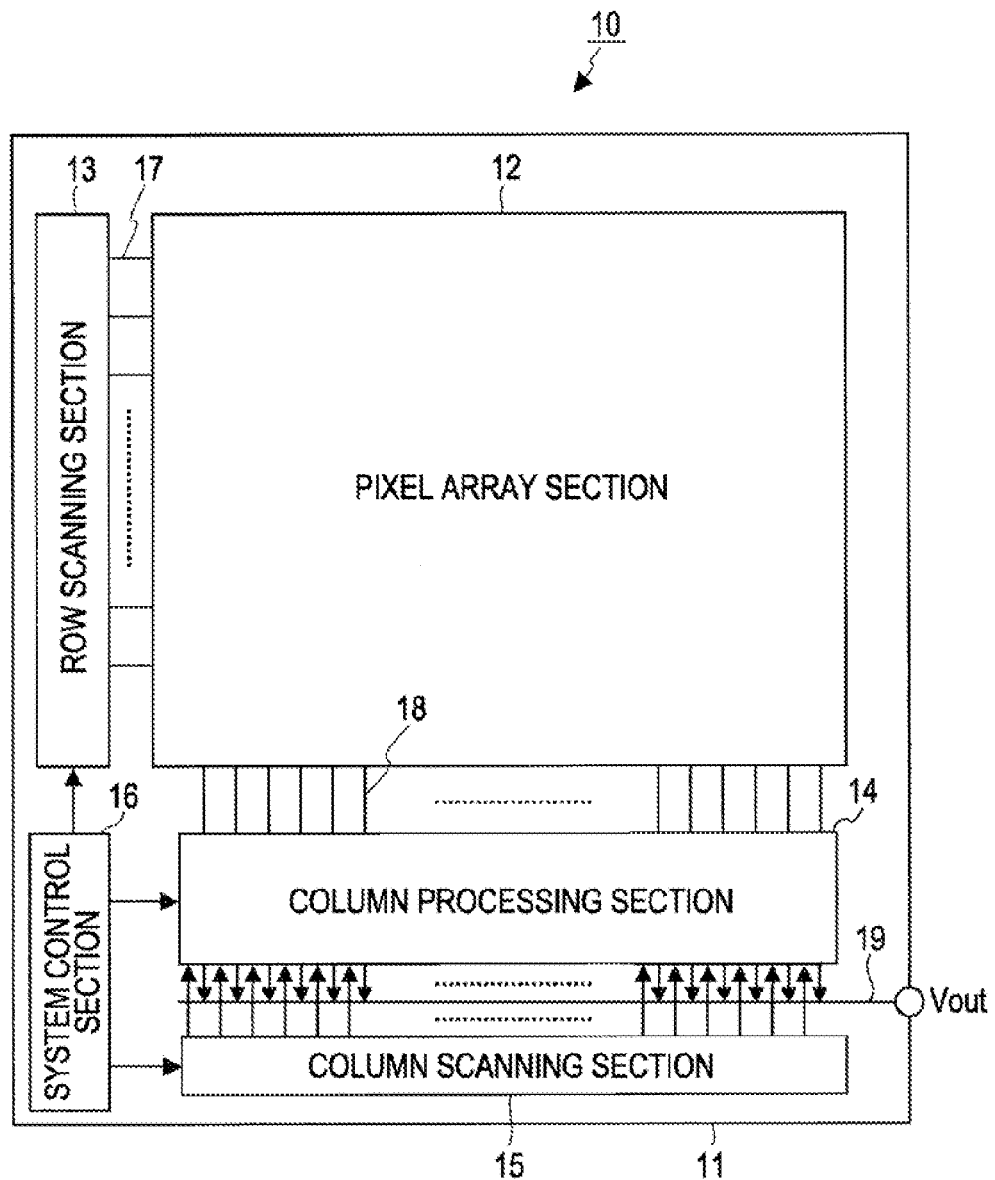
FIG. 1 is a system configuration diagram illustrating a schematic configuration of a CMOS image sensor to which the present invention is applied.

1. Solid-State Imaging Device to which the Present Invention is Applied 1.1 System Configuration FIG. 1 is a system configuration diagram illustrating a schematic system configuration of a CMOS image sensor, which is a kind of solid-state imaging devices to which the present invention is applied, for example, an X-Y addressing solid-state imaging device. Here, a CMOS image sensor is an image sensor created by applying or partially using a CMOS process.

The CMOS image sensor 10 according to the present embodiment has a configuration including a pixel array section 12 formed on a semiconductor substrate 11, and a surrounding circuit section integrated on a same semiconductor substrate 11 as that of the pixel array section 12. The surrounding circuit section includes, for example, a row scanning section 13, a column processing section 14, a column scanning section 15, and a system control section 16.

The pixel array section 12 includes a unit pixel (hereinafter sometimes referred to simply as a "pixel") having a photoelectric conversion element which generates a light electric charge in accordance with an amount of incident light and stores the charge inside. The unit pixels are disposed in a two-dimensional matrix. A description will be later given of a specific configuration of the unit pixel.

In the pixel array section 12, a pixel drive line 17 is wired in a row direction (a pixel-arrangement direction of a pixel row) for each pixel row of the matrix-state pixel array, and a vertical signal line 18 is wired in a column direction (a pixel-arrangement direction of a pixel column) for each pixel column of the pixel array. The pixel drive line 17 transmits a drive signal for driving to read out a signal from a pixel. In FIG. 1, one wiring line is shown for a pixel drive line 17. However, the line is not limited to one. One end of the pixel drive line 17 is connected to an output end corresponding to each row of the row scanning section 13.

The row scanning section 13 includes a shift register, an address decoder, etc., and is a pixel drive section driving each pixel of the pixel array section 12 simultaneously for all the pixels or for each row, etc. A specific configuration of the row scanning section 13 is omitted to be shown in the figure. In general, the configuration includes two scanning sections, namely a read scanning section and a sweep scanning section.

The read scanning section selectively scans a unit pixel of the pixel array section 12 in sequence for each row in order to read out a signal from the unit pixel. The signal read out from the unit pixel is an analog signal. The sweep scanning section performs sweep scanning for each readout row to be subjected to read scanning by the read scanning section a shutter-speed time period prior to the read scanning.

By the sweep scanning performed by the sweep scanning section, unnecessary charges are swept out from photoelectric conversion elements of the unit pixels in a readout row so that the photoelectric conversion elements are reset. And a so-called electronic shutter operation is performed by the sweeping (reset) of unnecessary electric charges by the sweep scanning system. Here, an electronic shutter operation is said to be an operation to discard light electric charges of a photoelectric conversion element, and to newly start exposure (starts storing light electric charge) operation.

The signal read out by a readout operation by the read scanning system corresponds to an amount of incident light after a readout operation immediately before or an electronic shutter operation immediately before. And a period from the readout timing by the readout operation immediately before or the sweep timing of the electronic shutter operation to the readout timing by the readout operation of this time becomes a storage period (exposure period) of a light electric charge in the unit pixel.

A signal output from each unit pixel of the pixel row selectively scanned by the row scanning section 13 is supplied to the column processing section 14 through the vertical signal line 18. The column processing section 14 performs predetermined signal processing on a signal output from each pixel of the selected row through the vertical signal line 18 for each pixel column of the pixel array section 12, and temporarily holds the pixel signal after the signal processing.

Specifically, the column processing section 14 receives a signal of a unit pixel, and performs signal processing, for example, noise elimination by CDS (Correlated Double Sampling), signal amplification, AD (analog to digital) conversion, etc., on the signal. By the noise elimination processing, pixel-specific fixed pattern noise, such as reset noise, variations of the threshold values of amplification transistors, etc., are eliminated. In this regard, here, the exemplified signal processing is only an example, and the signal processing is not limited to these kinds of processing.

The column scanning section 15 includes a shift register, an address decoder, etc., and selects a unit circuit corresponding to a pixel column of the column processing section 14 in sequence. By the selective scanning by the column scanning section 15, the pixel signal having been subjected to the signal processing by the column processing section 14 is output in sequence to a horizontal bus 19, and is transmitted to the outside of the semiconductor substrate 11 through the horizontal bus 19.

The system control section 16 receives a clock given from the outside of the semiconductor substrate 11, operation-mode instruction data, etc., and also, outputs data, such as internal information of the CMOS image sensor 10, etc. The system control section 16 further includes a timing generator generating various kinds of timing signals, and performs drive control of the surrounding circuit section, such as the row scanning section 13, the column processing section 14, and the column scanning section 15, etc., on the basis of the various kinds of the timing signals generated by the timing generator.

1.2 Circuit Configuration of Unit Pixel

Figure 2:
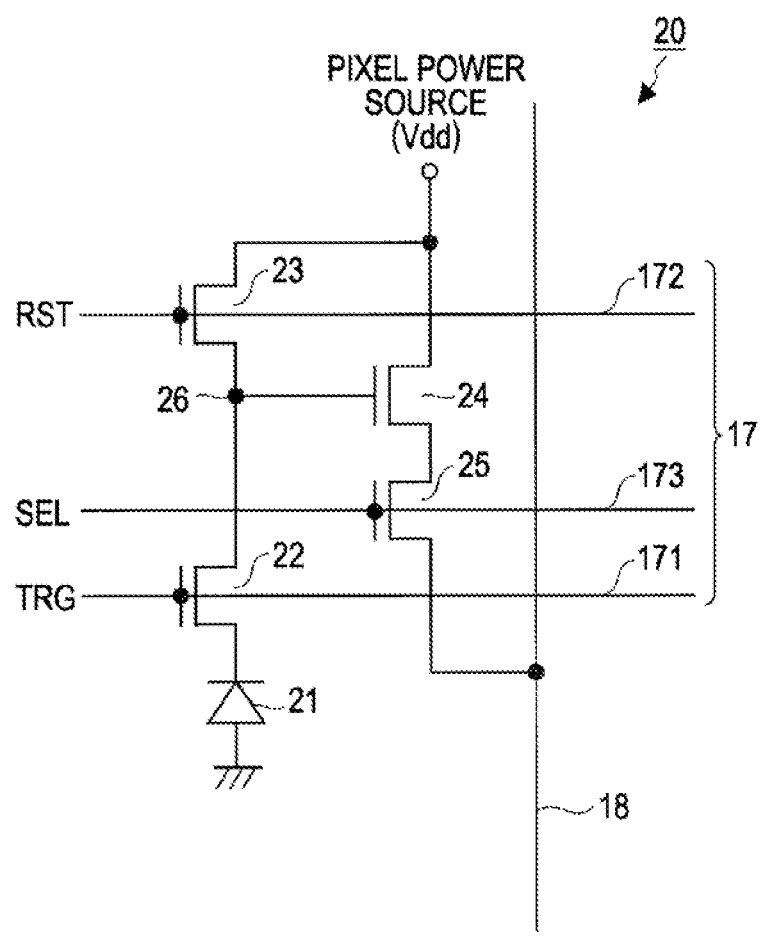
FIG. 2 is a circuit diagram illustrating an example of a configuration of a unit pixel of a general CMOS image sensor.

FIG. 2 is a circuit diagram illustrating an example of a configuration of a unit pixel of a general CMOS image sensor. As shown in FIG. 2, the unit pixel 20 according to the example of the configuration has four transistors, for example, a transfer transistor 22, a reset transistor 23, an amplification transistor 24, and a selection transistor 25 in addition to a photodiode 21, for example, which is a photoelectric conversion section.

Here, as the four transistors 22 to 25, for example, N-channel MOS transistors are used. However, here, the exemplified conductive-type combination of the transfer transistor 22, the reset transistor 23, the amplification transistor 24 and the selection transistor 25 is only one example, and the present invention is not limited to the combination.

For the unit pixel 20, for example three drive lines, namely a transfer line 171, a reset line 172, and a selection line 173 are disposed in common for each pixel of a same pixel row as the pixel drive line 17. Each one end of the transfer line 171, the reset line 172 and the selection line 173 is connected to an output end corresponding to each pixel row of the row scanning section 13 for each pixel row, and transmits a transfer pulse TRG, which is a drive signal driving the pixel 20, a reset pulse RST, and a selection pulse SEL.

The anode electrode of the photodiode 21 is connected to a negative power source (for example, ground). The photodiode 21 performs photoelectric conversion on the received light to produce light electric charges (here, photoelectrons) in accordance with the amount of light, and stores the light electric charges. The cathode electrode of the photodiode 21 is electrically connected to the gate electrode of the amplification transistor 24 through the transfer transistor 22. A node 26 electrically connected to the gate electrode of the amplification transistor 24 is called an FD (floating-diffusion region/impurity-diffusion region) section.

The transfer transistor 22 is connected between the cathode electrode of the photodiode 21 and the FD section 26. A transfer pulse TRG, which becomes active (hereinafter referred to as "high active") by a high level (for example, a Vdd level), is given to the gate electrode of the transfer transistor 22 through the transfer line 171. The transfer transistor 22 becomes an on state in response to the transfer pulse TRG, and transfers the light electric charges produced by the photoelectric conversion by the photodiode 21 to the FD section 26.

The drain electrode and the source electrode of the reset transistor 23 are connected to a pixel power source Vdd, and the FD section 26, respectively. A high-active reset pulse RST is given to the gate electrode of the reset transistor 23 through the reset line 172. The reset transistor 23 becomes an on state in response to the reset pulse RST, and discards the electric charges of the FD section 26 to the pixel power source Vdd so as to reset the FD section 26.

The gate electrode and the drain electrode of the amplification transistor 24 are connected to the FD section 26 and the pixel power source Vdd, respectively. The amplification transistor 24 becomes an input section of a source follower, which is a readout circuit reading out a signal obtained by the photoelectric conversion in the photodiode 21. That is to say, the source electrode of the amplification transistor 24 is connected to the vertical signal line 18 through the selection transistor 25, thereby the amplification transistor 24 constitutes a source follower with a power source connected to one end of the vertical signal line 18.

For example, the drain electrode and the source electrode of the selection transistor 25 are connected to the source electrode of the amplification transistor 24 and the vertical signal line 18, respectively. A high-active selection pulse SEL is given to the gate electrode of the selection transistor 25 through the selection line 173. The selection transistor 25 becomes an on state in response to the selection pulse SEL, changes the unit pixel 20 to a selected state, and relays the signal output from the amplification transistor 24 to the vertical signal line 18.

In this regard, it is possible to employ a circuit configuration in which the selection transistor 25 is connected between the pixel power source Vdd and the drain of the amplification transistor 24.

Also, the unit pixel 20 is not limited to have a pixel configuration including the four transistors with the above-described configuration. For example, a pixel configuration including three transistors, one of which serves both as the amplification transistor 24 and the selection transistor 25, etc., may be employed, and any pixel circuit configuration may be used.

1.3 Pixel Structure According to Reference Examples

Incidentally, as a pixel structure in which noise generated for each reset operation, for example, a noise component caused by fluctuations of the reset voltage Vdd is suppressed, a pixel structure having a low impurity concentration on the reset transistor 23 side of the FD section 26 is considered. A description will be given of the pixel structures as pixel structures according to reference examples 1 and 2 as follows. In this regard, as described before, fluctuations of the reset voltage Vdd causes image-quality deterioration, such as luminance unevenness on the screen, etc.

Pixel Structure According to Reference Example 1

Figure 3A:
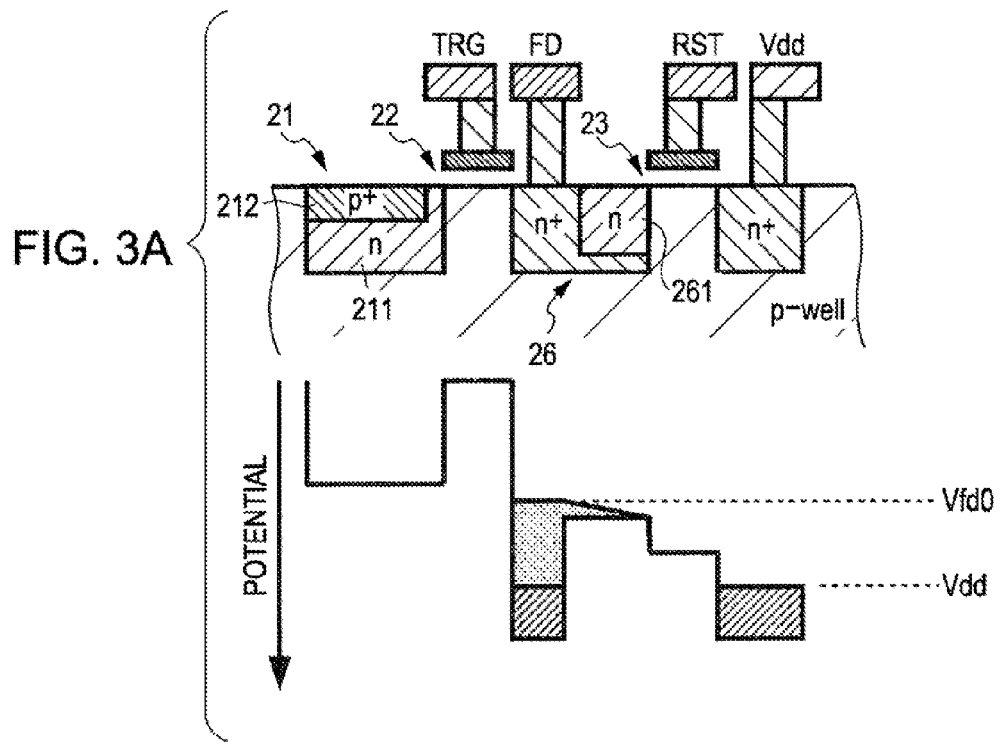
FIGS. 3A and 3B are diagrams illustrating sectional structures and potential distributions of pixel structures according to a reference example 1 and a reference example 2, respectively.

FIG. 3A is a diagram illustrating a sectional structure of a pixel structure and a potential distribution according to the reference example 1. As shown in FIG. 3A, the FD section 26 including an impurity-diffusion region has a structure in which a portion of the reset transistor 23 side is an n impurity-diffusion region 261. The reason for employing this structure is that if the source-drain voltage of the reset transistor 23 is set to the power-source voltage Vdd, a layer between the reset transistor 23 and the FD section 26 becomes a depletion state.

As a typical impurity concentration, it is assumed that for example, the impurity concentration of a p-well is 10 to the 16th power ($cm^{-3}$), and impurity concentration of the source/drain of the reset transistor 23 is 10 to the 20th power ($cm^{-3}$). In this case, an n-type impurity 261 at the reset transistor 23 side of the FD section 26 is made to have a concentration of between 10 to the 16th power and the 17th power ($cm^{-3}$) so that the layer between the reset transistor 23 and the FD section 26 can be in a depletion state.

Also, in this case, as a typical example, an n region 211 of the photodiode 21 has a concentration of between 10 to the 16th power and the 17th power ($cm^{-3}$), and p+ region 212 on the surface has a concentration of about 10 to the 18th power ($cm^{-3}$). However, if a relative difference in the concentration is obtained, the values are not limited to these.

Pixel Structure According to Reference Example 2

Figure 3B:
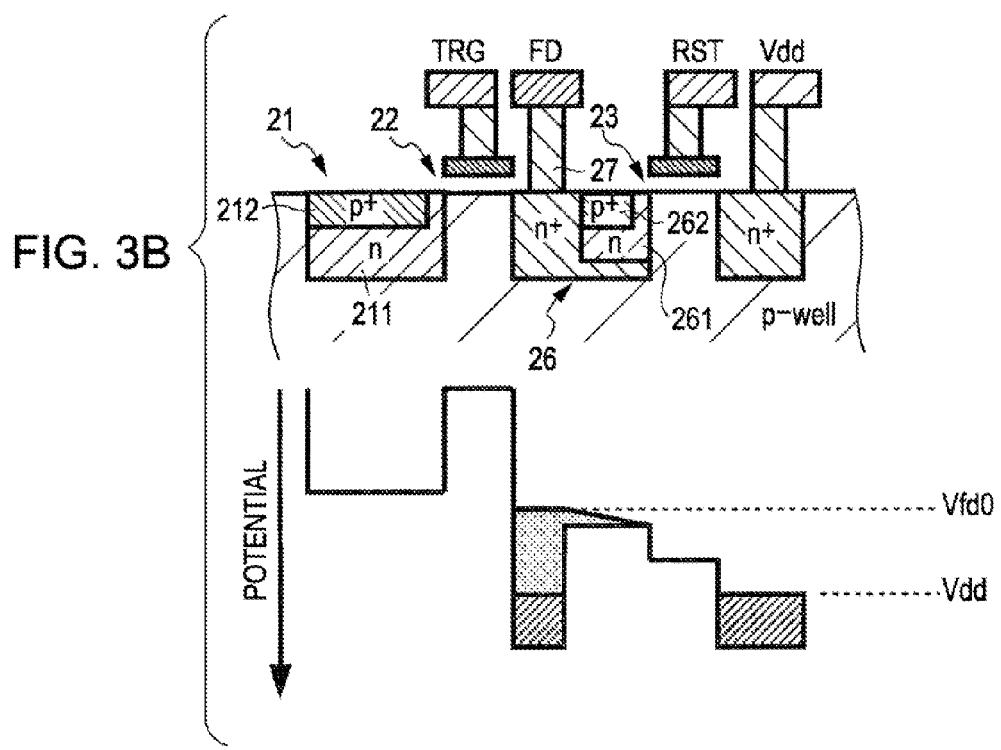

FIG. 3B is a diagram illustrating a sectional structure of a pixel structure and a potential distribution according to the reference example 2. The pixel structure according to the reference example 2 is a structure in which a impurity-diffusion region 262 is formed on a surface layer other than an area to which a contact section 27 of the FD section 26 is connected in the pixel structure according to the reference example 1. With this pixel structure, a dark current generated in crystal defects on a silicon surface can be reduced.

Operation Effect of Pixel Structures According to Reference Examples 1 and 2

In the pixel structures according to the above-described reference examples 1 and 2, the reset level Vfd0 at the time the reset transistor 23 is turned on is determined not by the reset voltage Vdd, but by the depletion potential. This is because an impurity-diffusion concentration at the reset transistor 23 side of the FD section 26 is made low to be depleted.

By employing this pixel structure, when the reset transistor 23 is turned on, a level Vfd0 determined by the depletion potential is set to the voltage of the FD section 26, thereby there is no influence of the noise caused by the fluctuations of the reset voltage Vdd. The reset level Vfd0 varies for each pixel by the difference in the impurity concentration. However, there is no problem because it is also possible to eliminate an offset noise component that is fixed for each pixel in a noise elimination operation (refer to FIG. 29) by performing the reset operation after the readout of the signal level.

Problems of Pixel Structures According to Reference Examples 1 and 2

However, there is a problem in that the reset level Vfd0 has very bad convergence because an electric field is scarcely impressed from the FD section 26 to the power source Vdd side electrode (drain electrode) of the reset transistor 23, and converges by thermal diffusion, thereby resulting in deterioration of image quality as residual images.

As shown in FIG. 4, if the FD voltages Vfd immediately before the rest are Vini0(A) and Vini1(B), respectively, after a certain time period, the FD voltages at the timing of turning off the reset transistor 23 Vfd0 and Vfd1 do not become equal. Here, Vini0≠Vini1.

Figure 5:
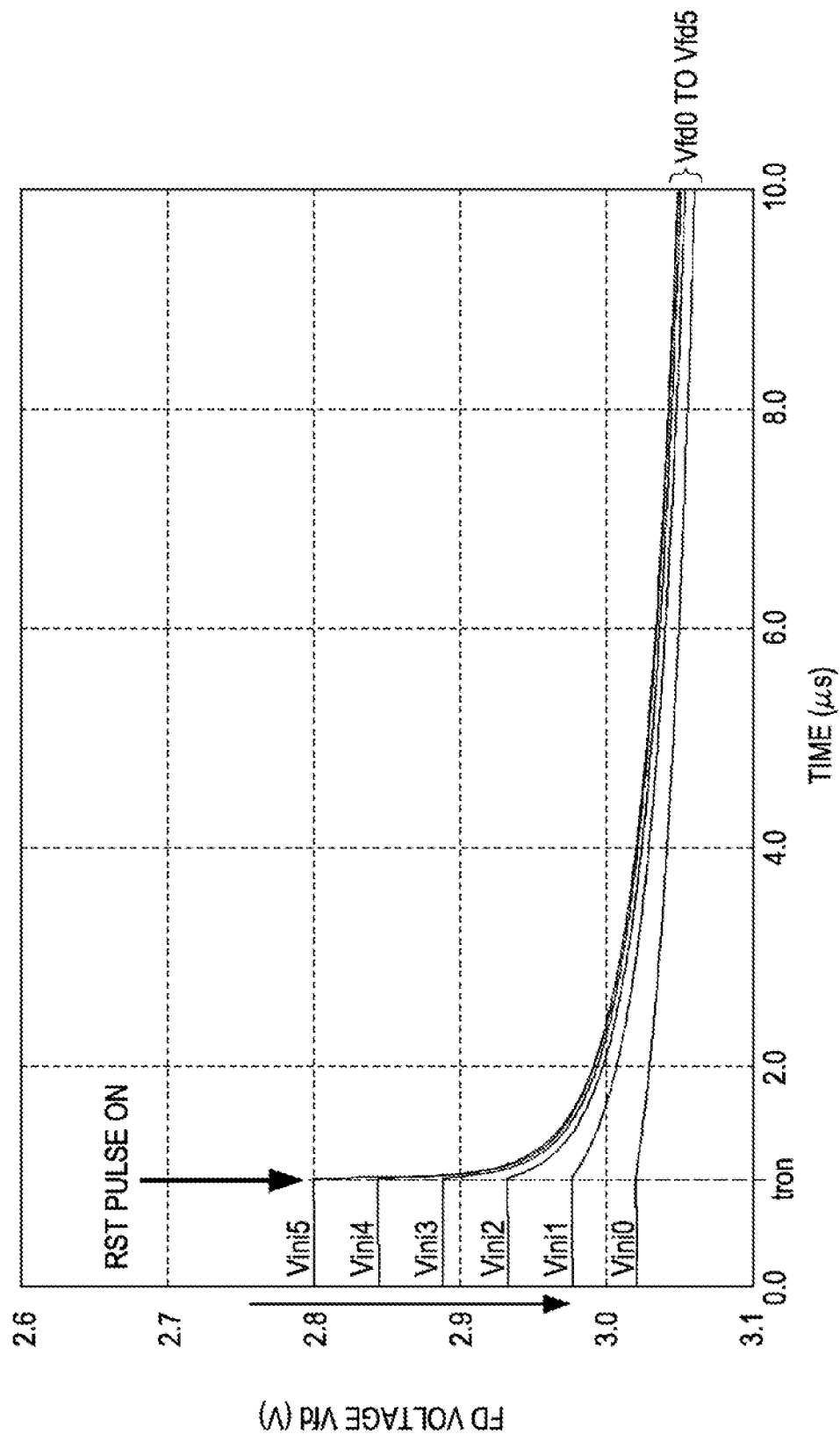
FIG. 5 is a graph showing states of changes in an FD voltage Vfd when pixel structures according to the reference example 1 and the reference example 2 are employed.

FIG. 5 illustrates a state of the change of the FD voltage Vfd in the case of employing the pixel structures according to the reference examples 1 and 2. As one example, even in the case of an imaging apparatus having about 1920 columns×1080 rows, namely 2 million pixels, in order to obtain a video of 60 pieces per second, it is necessary to complete readout operation in about 16.6 μs for each row. Thus, only a few microseconds are ensured for the reset operation at most.

That is to say, the convergent voltage has different values in the case of performing a reset operation in a state of holding many signal charges and in the other cases, resulting in the occurrence of a residual image of one frame before.

2. First Embodiment

A first embodiment according to the present invention is made such that at the time of readout driving of a reset level after readout of a signal level, random noise and unevenness on a screen are reduced at reset time, and image-quality deterioration caused by a residual-image phenomenon at reset operation time is reduced.

For that purpose, in the first embodiment, the CMOS image sensor 10 in FIG. 1 has a drive circuit which changes the drain voltage VRD of the reset transistor 23 from a first voltage Vrst1 to a second voltage Vrst while the reset transistor 23 is on. This drive circuit corresponds to the row scanning section 13 driving each pixel 20 of the pixel array section 12 for each row.

Here, the drain voltage VRD of the reset transistor 23 is a reset voltage resetting the FD section 26. Also, the first voltage Vrst1 is a voltage lower than a depletion potential of a layer between the above-described reset transistor 23 and the FD section 26, and the second voltage Vrsth is a voltage higher than the depletion potential.

2.1 Pixel Structure

Figure 6:
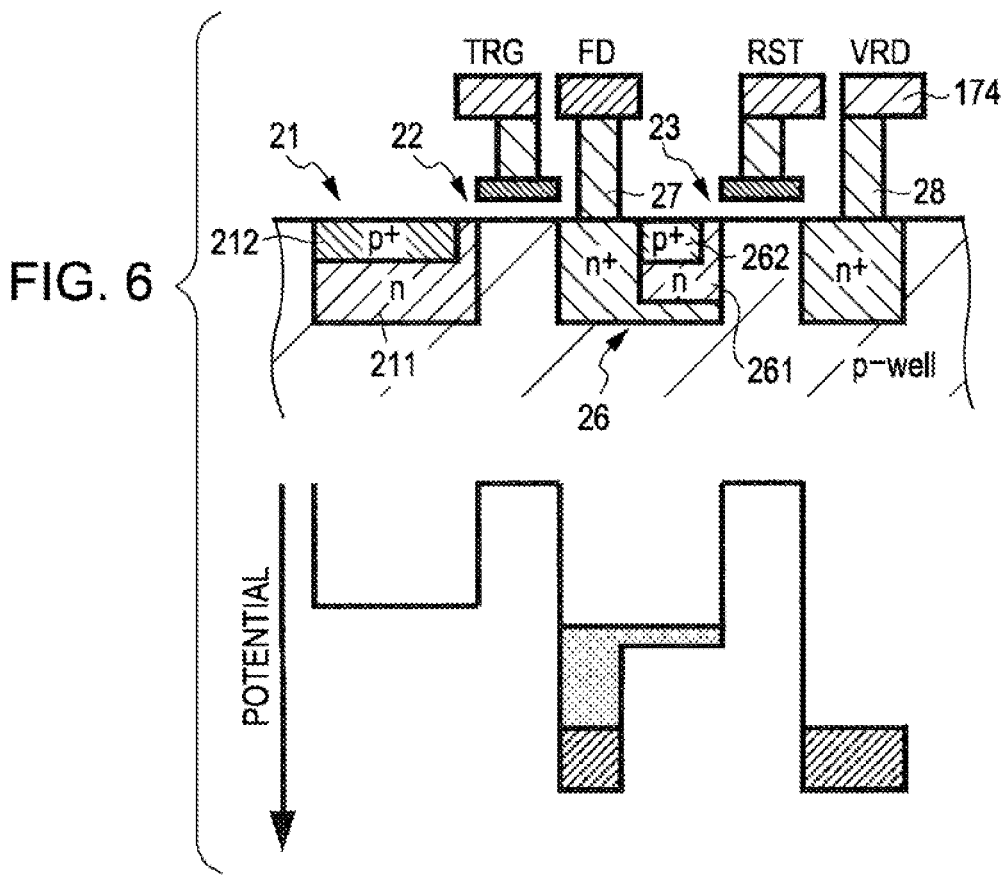
FIG. 6 is a diagram illustrating a sectional structure and a potential distribution of a pixel structure according to a first embodiment.

FIG. 6 is a diagram illustrating a sectional structure and a potential distribution of a pixel structure according to the first embodiment. The pixel structure according to the present embodiment employs, for example the pixel structure according to the reference example 1 as a basic structure. Specifically, in the FD section 26 including $n^+$ impurity, a reset transistor 23 side part is formed to be an n region 261, and a $p^+$ region 262 is formed on a surface layer other than a part connecting to the contact section 27 of the FD section 26.

Here, the pixel structure according to the reference example 1, that is to say, the structure in which at least the impurity concentration of a part of the reset transistor 23 side of the FD section 26 is made low so that the reset transistor 23 side of the FD section 26 is depleted is employed as a basic structure. In place of the pixel structure according to the reference example 1, the pixel structure according to the reference example 2, that is to say, the structure in which a p-type impurity-diffusion region is formed on a part of the surface layer of the FD section 26 can be employed as a basic structure.

In the case of the pixel structure according to the reference example 2, the p-type impurity-diffusion region on the surface layer has an advantage of preventing a leak component of a dark current, etc., occurring by defects of a silicon surface to be stored in n-type diffusion region, namely the FD section 26. This is because positive holes are sufficiently stored in the p-type impurity-diffusion region so that electric charges generated on the surface are recombined.

Here, as a typical impurity concentration, it is assumed that for example, the impurity concentration of a p-well is 10 to the 16th power ($cm^{-3}$), and an impurity concentration of the source/drain of the reset transistor 23 is 10 to the 20th power ($cm^{-3}$). In this case, as described before, an n-type impurity 261 at the reset transistor 23 side of the FD section 26 is made to have a concentration of between 10 to the 16th power and the 17th power ($cm^{-3}$) so that the layer between the reset transistor 23 and the FD section 26 can be in a depletion state. However, these values are only one example, and not limited to the above.

And in the reference examples 1 and 2, the drain voltage VRD of the reset transistor 23 is fixed to the power-source voltage Vdd. In contrast, in the present embodiment, while the reset transistor 23 is on, the drain voltage VRD of the reset transistor 23 is changed from the voltage Vrst1 lower than a depletion potential to the voltage Vrsth higher than the depletion potential.

The drain voltage VRD of the voltage Vrst1/voltage Vrsth is given to the drain region of the reset transistor 23, which is formed by the impurity-diffusion region from a drain drive line 174 through a contact section 28. Here, the drain drive line 174 is a voltage supply line giving a reset voltage to the FD section 26 through the reset transistor 23.

Figure 7:
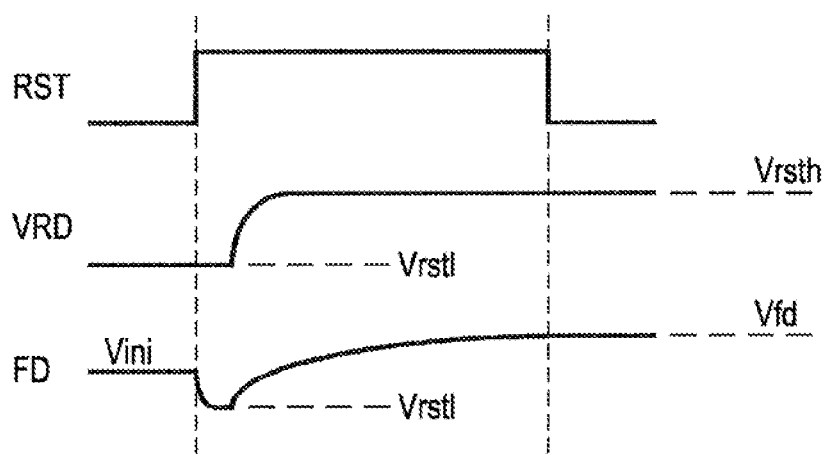
FIG. 7 is a timing waveform chart illustrating a state of transition of a reset pulse RST, a drain voltage VRD of a reset transistor, and a FD voltage.

FIG. 7 illustrates a state of transition of the reset pulse RST, the drain voltage VRD of the reset transistor 23, and the voltage of the FD section 26 (FD voltage). With reference to the timing waveform chart in FIG. 7, a description will be given of an example of operation in the pixel structure according to the first embodiment using an operation explanatory diagram in FIG. 8.

In the initial state, the drain voltage VRD of the reset transistor 23 has the voltage Vrst1 (high/shallow potential), which is lower than the depletion potential Vdep. At this time, the potential of the FD section 26 has an initial value Vini, which is higher (shallower) than the depletion potential (FIG. 8A). And the reset pulse RST changes from inactive (a low level) to active (a high level), and the reset transistor 23 changes to an on state so that the FD voltage converges to the voltage Vrst1 in a very short time (FIG. 8B).

After that, while the reset transistor 23 is on, the drain voltage VRD of the reset transistor 23 changes to a potential (high voltage Vrsth) which is lower (deeper) than a depletion potential Vdep (FIG. 8C). Thereby, the FD voltage converges to a voltage Vfd determined by the depletion potential Vdep (FIG. 8D).

Figure 9:
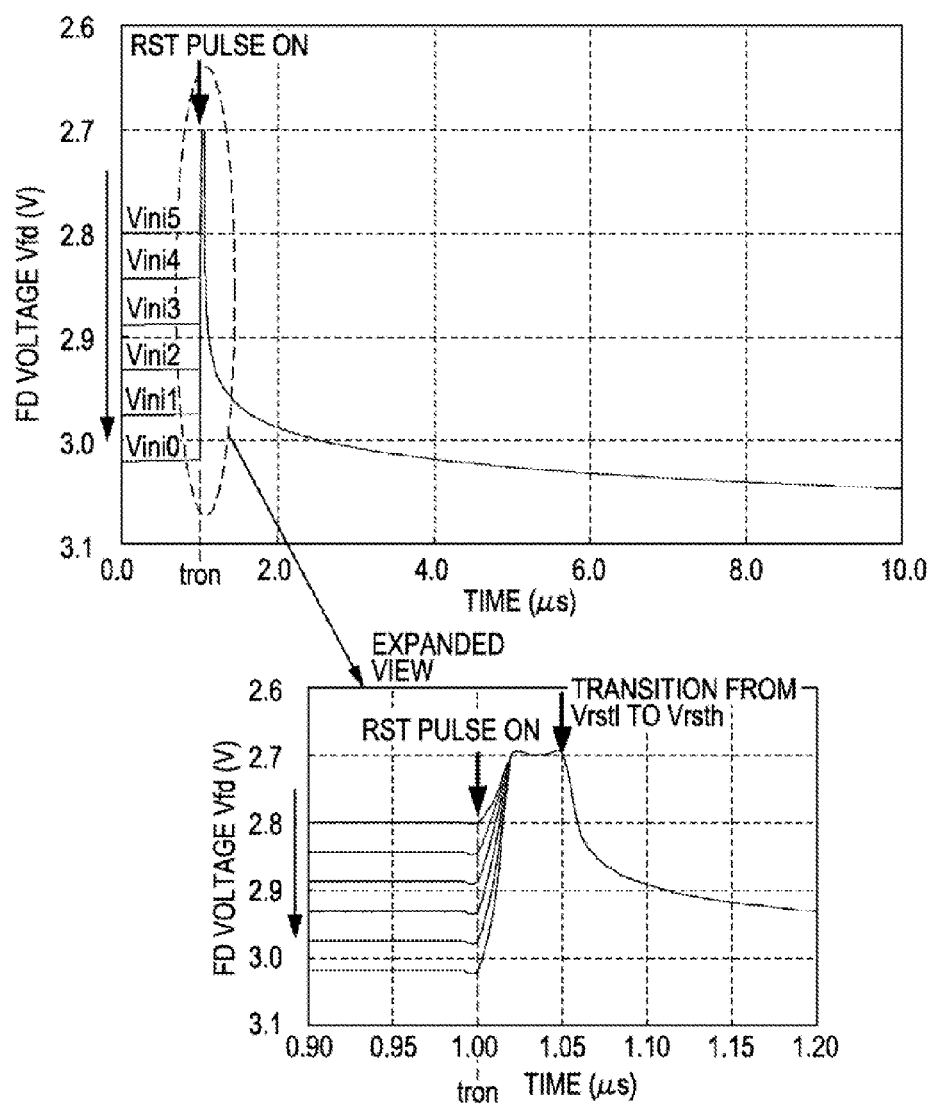
FIG. 9 is a graph showing a state of transition of an FD voltage Vfd when an initial value Vini of the FD voltage Vfd has different values (Vini0 to Vini5).

At this time, it is understood that the influence of the initial value Vini is suppressed, and the FD voltage converges to the same voltage Vfd from any state. FIG. 9 illustrates a state of transition of the FD voltage Vfd when an initial value Vini of the FD voltage Vfd has different values (Vini0 to Vini5).

As described above, by changing the drain voltage VRD of the reset transistor 23 from the first reset transistor 23 to the second voltage Vrsth while the reset transistor 23 is on, the following operation effect can be obtained. That is to say, the FD voltage converges to the voltage Vfd determined by the depletion potential Vdep without being influenced by the initial potential value Vini of the FD section 26. As a result, in the readout operation of the reset level after the readout of the signal level, it is possible to reduce random noise at reset time and unevenness on the screen, and to suppress image-quality deterioration caused by residual images (a residual image dependent on the initial state) at the time of the reset operation of the FD section.

In the present embodiment, a structure in which an n-type impurity-diffusion region is formed in a p-type impurity-well region is taken as an example. However, a structure having regions with the opposite p-type and n-type impurities may be employed. In that case, the potential and the voltage to be impressed are reversed between the power-source voltage and the ground voltage.

Example of Driving when Electric Charge is Directly Stored in the FD Section

The present embodiment is not limited to be applied to the pixel structure in which the electric charges stored in the photodiode 21 are transferred to the FD section 26 by the transfer transistor 22. For example, the present embodiment can be applied to the pixel structure in which the transfer transistor 22 is omitted and the electric charges are directly stored in the FD section 26.

Figure 10:
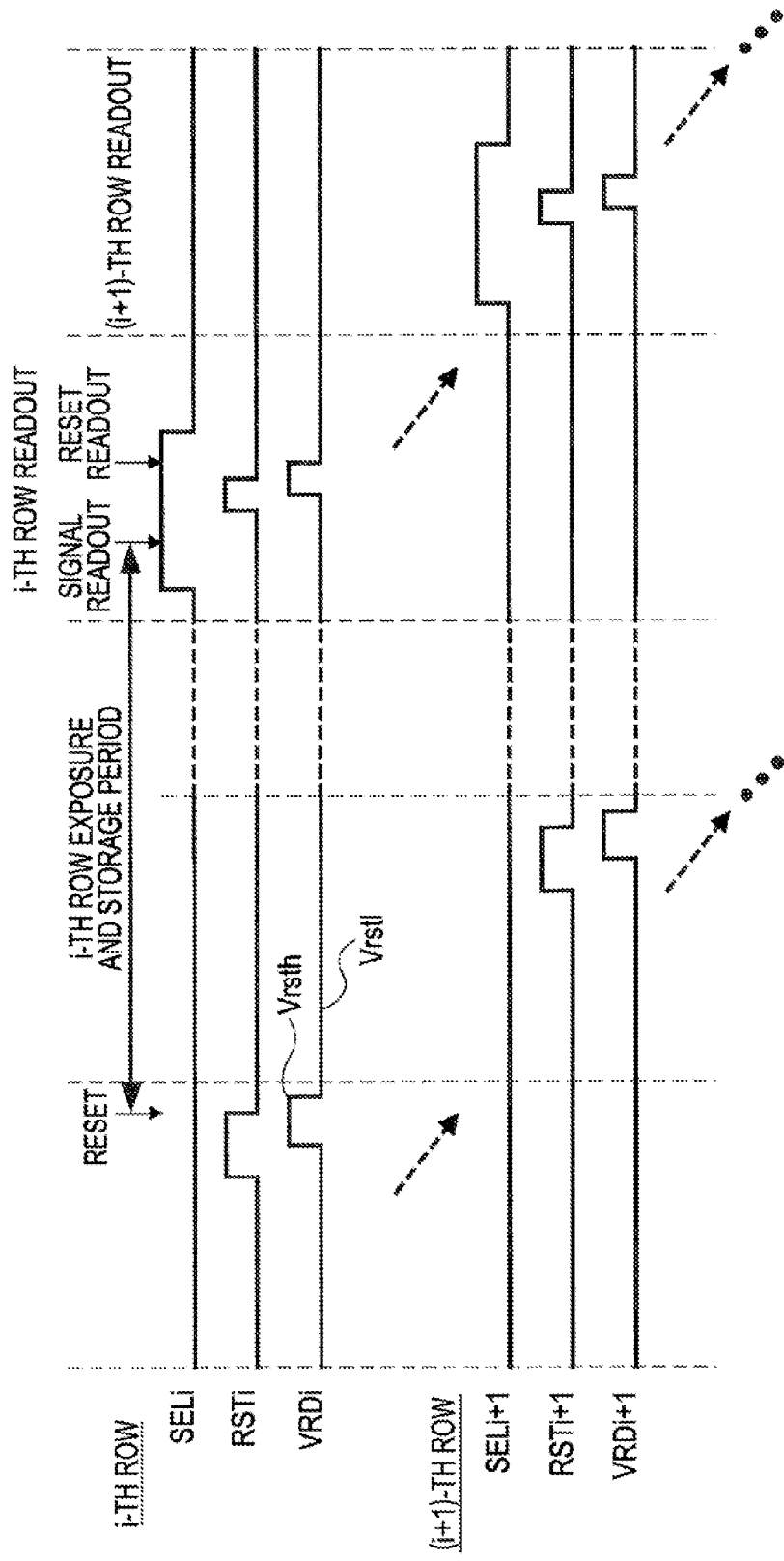
FIG. 10 is a timing chart for explaining an example of driving when electric charge is directly accumulated in an FD section according to the first embodiment.

Here, a description will be given of an example of driving when electric charges are directly stored in the FD section 26 using the timing chart in FIG. 10.

When electric charges are directly stored in the FD section 26, the FD section 26 is reset by the reset pulse RST, and the electric charges stored in the FD section 26 during the exposure/storage period are read as a signal level. Next, the FD section 26 is reset and is read as a reset level.

In the reset operation of the FD section 26 at exposure-start time and the reset operation of the FD section 26 after the signal readout, the drain voltage VRD of the reset transistor 23 changes from the voltage Vrst1 to the voltage Vrsth during the active period of the reset pulse RST.

In this example of driving, the drain voltage VRD of the reset transistor 23 is set to be the voltage Vrst1 in advance, and when the reset pulse RST has become an active state, the drain voltage VRD is changed to the voltage Vrsth. However, the present embodiment is not limited to this example of driving. That is to say, the drain voltage VRD of the reset transistor 23 may be set to any voltage, and when the reset pulse RST has become an active state, the drain voltage VRD may be set to the voltage Vrst1, and next the drain voltage VRD may be set to the voltage Vrsth. The subsequent processing is the same.

Example of Driving in Batch Exposure

Figure 11:
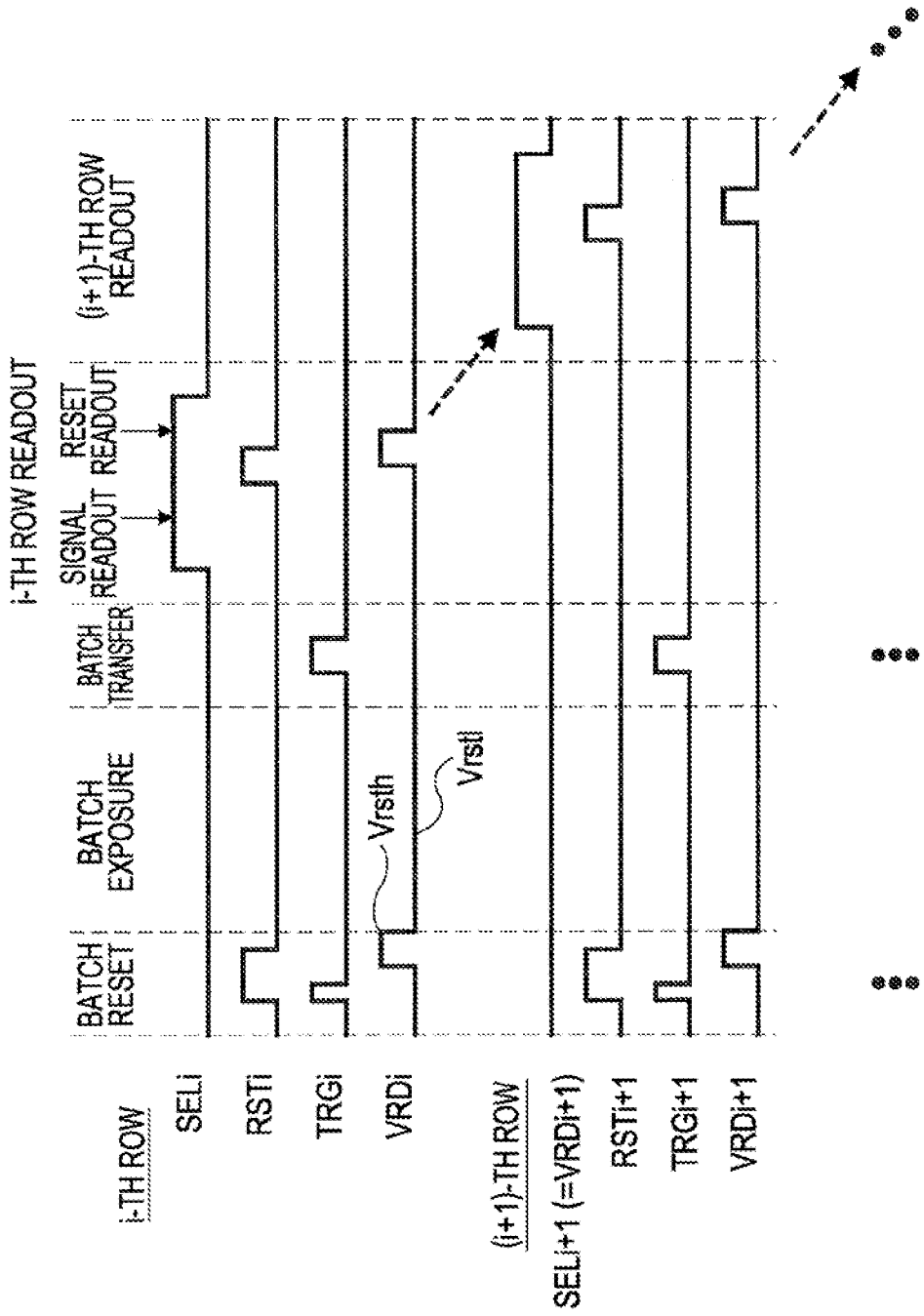
FIG. 11 is a timing chart for explaining an example of driving in batch exposure according to the first embodiment.

Next, a description will be given of an example of driving in a batch exposure using a timing chart in FIG. 11. The batch exposure is also called a global exposure (global shutter), and is an exposure operation performing photoelectric conversion for all the pixels in a same exposure period.

In a batch reset, the reset pulse RST and the transfer pulse TRG become an active state so that the electric charges of the photodiode 21 are discharged. While the reset pulse RST is active, the drain voltage VRD of the reset transistor 23 changes from the voltage Vrst1 to the voltage Vrsth.

The signal charge is transferred to the FD section 26 by the batch transfer, and the signal level is read out at the time of reading each row. Next, the FD section 26 is rest, and the reset level is read out. In the reset operation at this time, while the reset pulse RST is active, the drain voltage VRD of the reset transistor 23 is similarly changed from the voltage Vrst1 to the voltage Vrsth.

In this example of driving, the electric-charge discharge operation of the photodiode 21 is achieved by changing the transfer transistor 22 and the reset transistor 23 to an on state. However, the discharge operation is not limited to this example. For example, if the light receiving section has a discharge gate in addition to the transfer transistor 22, it is possible to carry out batch reset, which is an exposure start, using the discharge gate. In that case, it is also necessary to perform the reset operation of the FD section 26 before batch transfer, and thus the driving is performed by the same reset pulse RST and drain voltage VRD as the above-described example. It does not matter when that timing is as long as before the batch transfer.

Also, in this example of driving, the drain voltage VRD of the reset transistor 23 has a drain voltage VRDi for each row. However, the drain voltage VRD may be set in common with a plurality of rows or a plurality of columns, or in common with all the pixels. However, in view of power consumption reduction, it is preferable to wire a drain drive line 174, which gives the drain voltage VRD to the drain electrode of the reset transistor 23 for each row, and to drive with a drain voltage VRDi for each row.

Also, it is possible to use the drain drive line 174 and a power-source wiring line of the pixel section and in common, and to set the drain voltage VRD of the reset transistor 23 to the power-source voltage Vdd at the time other than the reset operation time of the FD section 26.

Figure 12:
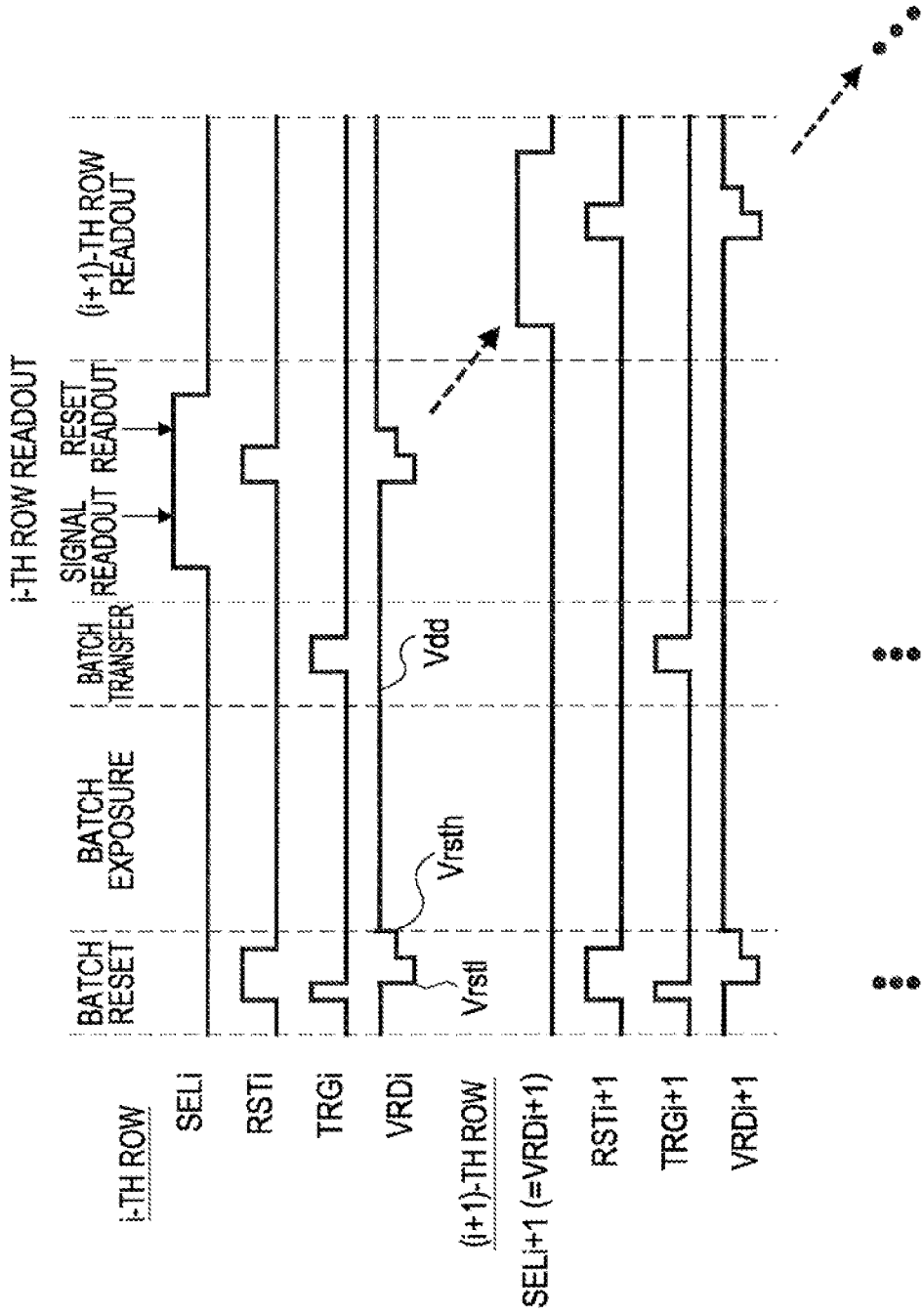
FIG. 12 is a timing chart for explaining an example of driving when a drain drive line and a power line of a pixel section are commonly used.

The example of driving in this case is shown by a timing chart in FIG. 12. As is apparent in FIG. 12, the drain voltage VRD of the reset transistor 23 is normally set to the power-source voltage Vdd. And the drain voltage VRD changes from the voltage Vrst1 to the voltage Vrsth while the reset pulse RST is in an active period.

Also, the voltage Vrsth and the power-source voltage Vdd may have a same potential on the condition that the power-source voltage Vdd has a higher potential than the depletion potential of the FD section 26. In the same manner, the voltage Vrst1 and a power-source voltage Vss may be a same potential on the condition that the negative side power-source voltage Vss has a lower potential than the depletion potential of the FD section 26.

2.2 Circuit Example

Incidentally, in the readout operation performed by the row scanning by the row scanning section 13 in FIG. 1, the FD section 26 is reset row-sequentially by the reset transistor 23. On the other hand, as described above, it is preferable that the drain drive line 174 (refer to FIG. 6), which gives the drain voltage VRD to the drain electrode of the reset transistor 23, is not wired in common with all the pixels, but is wired for each row in view of power consumption.

However, if the configuration of wiring the drain drive line 174 for each row is employed, the number of signal lines for each row increases so that the aperture of the pixel 20 becomes narrow (the aperture ratio decreases), and thus the sensitivity might be deteriorated. In view of this point, a circuit example of a pixel 20A according to the present embodiment has been made as described below.

Figure 13:
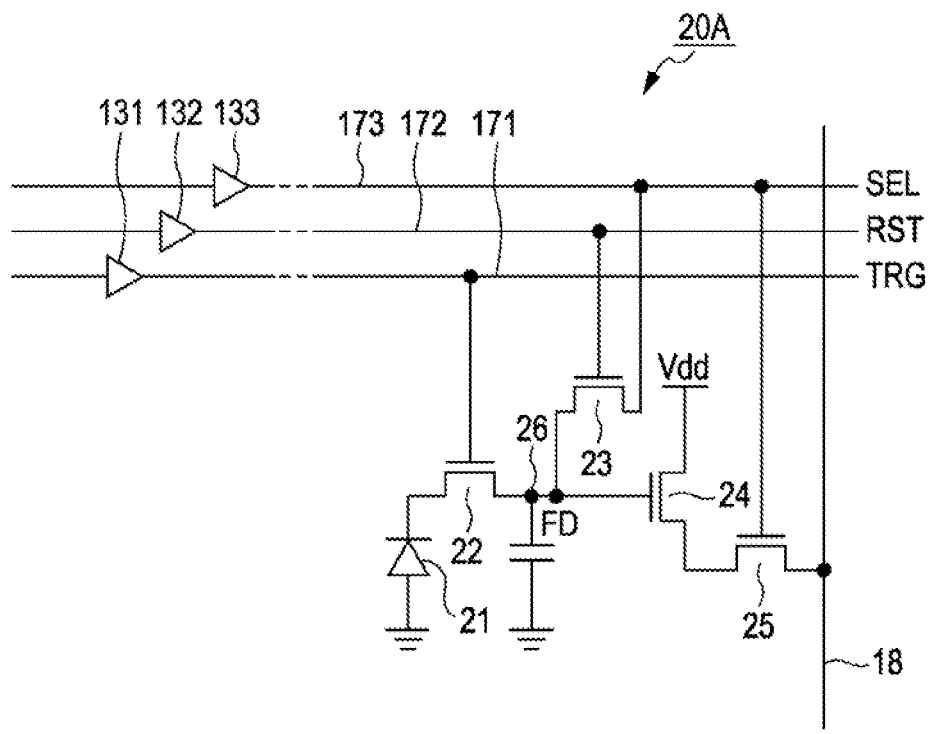
FIG. 13 is a circuit diagram illustrating an example of a pixel circuit according to the first embodiment.

FIG. 13 is a circuit diagram illustrating an example circuit of a pixel 20A according to the first embodiment. In FIG. 13, a same reference numeral is given to a same part (corresponding part) as that in FIG. 2, and an overlapping explanation will be omitted.

In FIG. 13, in the same manner as the circuit example in FIG. 2, the gate electrode of the transfer transistor 22 is connected to the transfer line 171, the gate electrode of the reset transistor 23 is connected to the reset line 172, and the gate electrode of the selection transistor 25 is connected to the selection line 173. The different point from the circuit example in FIG. 2 is that the drain electrode of the reset transistor 23 is connected to the selection line 173. Here, the selection line 173 is a voltage-supply line giving the reset voltage to the FD section 26 through the reset transistor 23.

The transfer pulse TRG having an amplitude Vss (in this example, ground level)–Vdd is given to the transfer line 171 through the drive circuit 131. The reset pulse RST having an amplitude Vss–Vdd is given to the reset line 172 through the drive circuit 132. The selection pulse SEL having an amplitude Vss–Vdd is given to the selection line 173 through the drive circuit 133.

Here, the drive circuits 131 to 133 are said to be circuits forming a output step of the row scanning section 13 shown in FIG. 1. And the drive circuit 133 selectively supplies the above-described first voltage Vrst1 and second voltage Vrsth to the selection line 173 in addition to the selection pulse SEL having the amplitude Vss–Vdd. A description will be given of specific circuit examples of the drive circuits 131 to 133 in the following.

Figure 14:
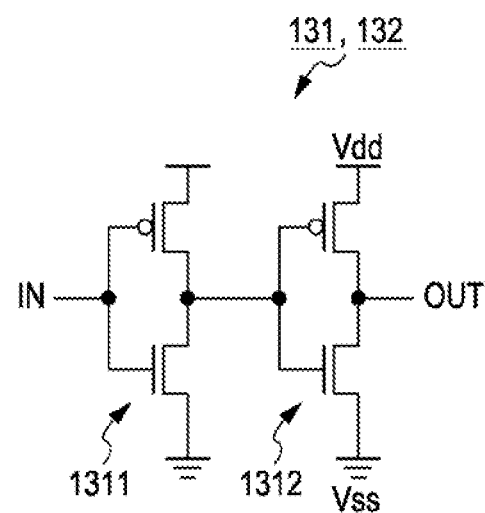
FIG. 14 is a circuit diagram illustrating a drive circuit according to a circuit example 1.

FIG. 14 is a circuit diagram illustrating a specific circuit example (circuit example 1) of the drive circuit 131 (132). As shown in FIG. 14, the drive circuit 131 (132) includes, for example, two-stage CMOS inverters 1311 and 1312. And at least the second stage CMOS inverter 1312 has the negative power source Vss and the positive power source Vdd as operating power sources. Thereby, the drive circuit 131 (132) outputs the transfer pulse TRG (reset pulse RST) having the amplitude Vss–Vdd.

Figure 15:
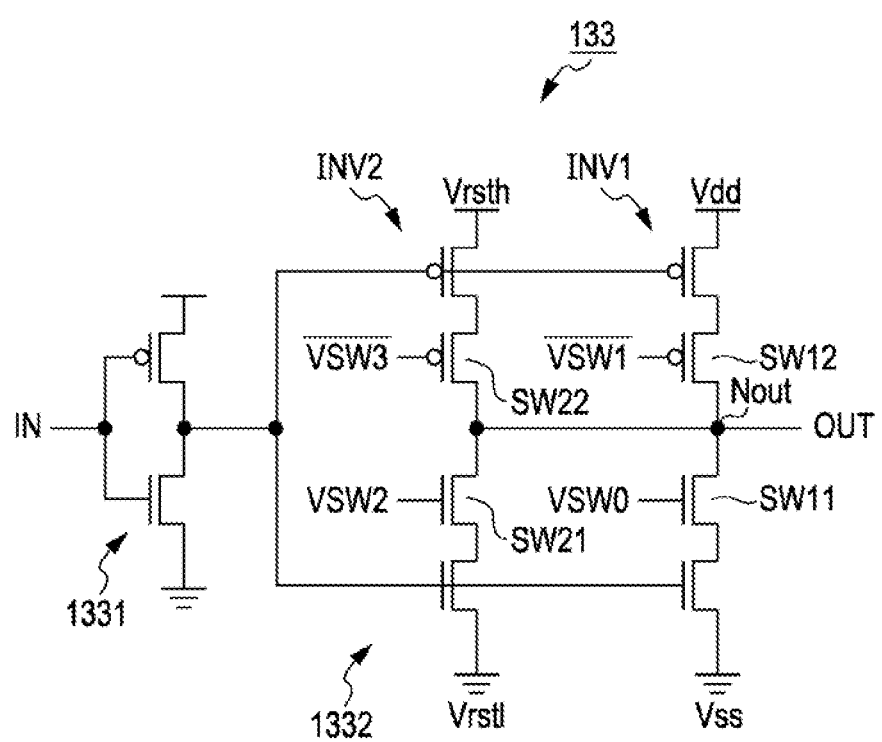
FIG. 15 is a circuit diagram illustrating a drive circuit according to a circuit example 2.

FIG. 15 is a circuit diagram illustrating a specific circuit example (circuit example 2) of the drive circuit 133. As shown in FIG. 15, the drive circuit 133 includes, for example, two-stage CMOS inverters 1331 and 1332. Note that the second stage CMOS inverter 1332 has a configuration in which two CMOS inverters INV1 and INV2 having different operating power sources are connected in parallel to an output node Nout.

And one of the CMOS inverters INV1 uses the negative-side power source Vss and the positive-side power source Vdd as operating power sources, and becomes an active state selectively by the switch transistors SW11 and SW12 connected between the output node Nout. Thereby, the drive circuit 133 outputs the selection pulse SEL having the amplitude Vss–Vdd. At this time, the power-source voltage Vdd becomes an active level of the selection pulse SEL, and the power-source voltage Vss becomes an inactive level of the selection pulse SEL.

Also, the other of the CMOS inverters INV2 uses the negative-side power source Vrst1 corresponding to the first voltage Vrst1 and the positive-side power source Vrsth corresponding to the second voltage Vrsth as the operating power source. And the positive side or the negative side of the CMOS inverter INV2 becomes an active state alternatively by the switch transistors SW21 and SW22 connected between the output node Nout. That is to say, the other of the CMOS inverters INV2 selectively outputs the first voltage Vrst1 and the second voltage Vrsth.

In the drive circuit 133 having such a configuration, the switch transistors SW11, SW12, SW21, and SW22 are suitably driven by drive signals VSW0, VSW1, VSW2, and VSW3. With this driving, the drive circuit 133 serves as a voltage selector outputting the selection pulse SEL of the amplitude Vss–Vdd, and alternatively outputs the first voltage Vrst1 and the second voltage Vrsth.

Here, as described above, if the voltage Vrsth and the power-source voltage Vdd have a same potential, and the voltage Vrst1 and the power-source voltage Vss have a same potential, it is possible to remove the CMOS inverter INV2 selectively outputting the voltage Vrst1 and the voltage Vrsth. As a result, it is possible to simplify the drive circuit 133 by the reduction of the CMOS inverter INV2, and thus to simplify the row scanning section 13.

As is apparent from the above, in the circuit example according to the present embodiment, the drain drive line 174 which gives the drain voltage VRD to the drain electrode of the reset transistor 23 is not newly disposed, and the pixel drive lines 17 are commonly used as the drain drive line 174. In this example, the selection line 173, which is one of pixel drive lines 17, serves as the drain drive line 174.

In this manner, by using the pixel drive lines 17 as the drain drive line 174, when the drain voltage VRD of the reset transistor 23 is changed from the first voltage Vrst1 to the second voltage Vrsth, it is possible to prevent an increase in the number of wiring lines for each pixel row of the pixel array section 12. Thereby, it is possible to enlarge the aperture ratio of the pixel 20A, and to reduce the surrounding circuit, and to reduce power consumption compared with the case of using the drain drive line 174 (refer to FIG. 6) as a wiring line common with all the pixels.

Figure 16:
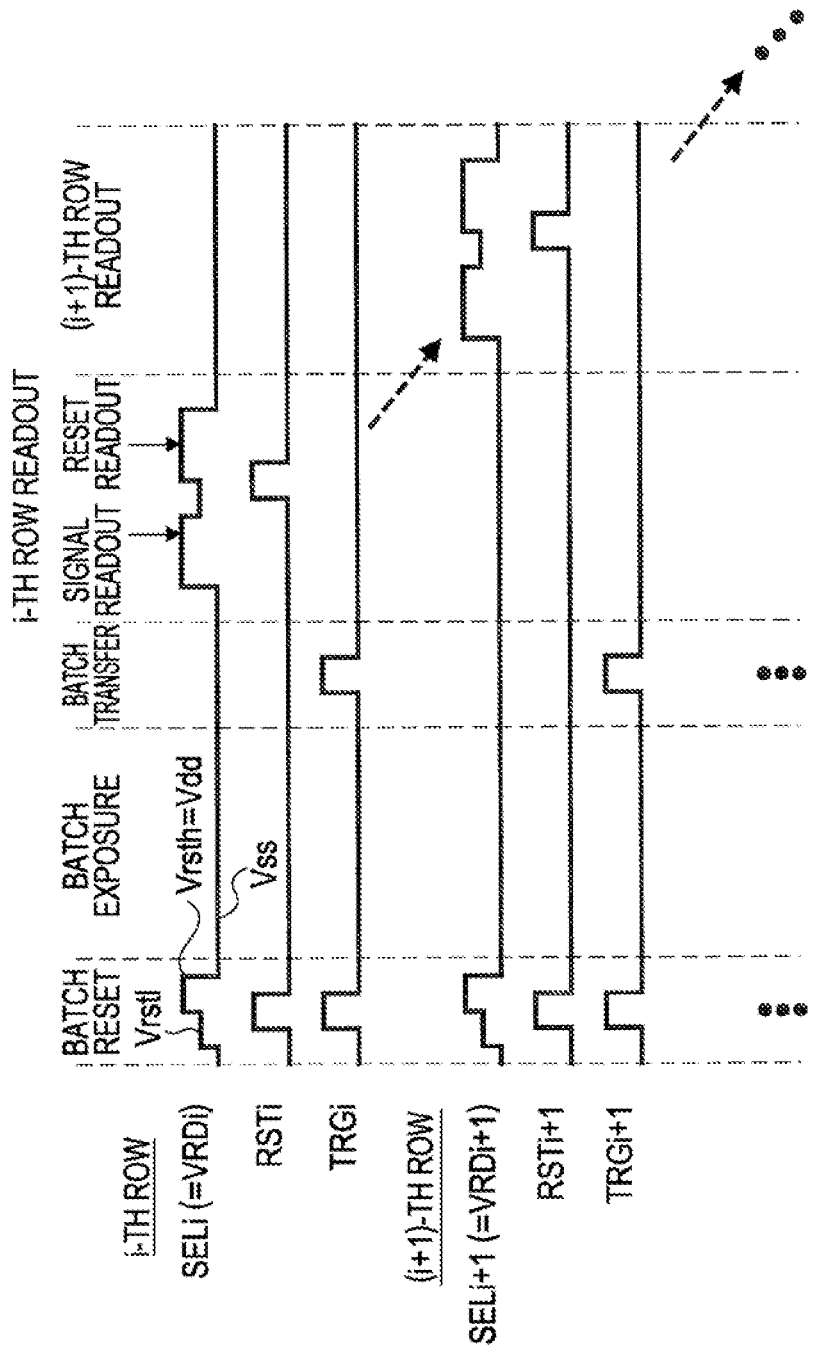
FIG. 16 is a timing chart for explaining an example of driving in the case of a circuit example according to the first embodiment.

FIG. 16 illustrates an example of driving in the case of a circuit example according to the first embodiment. In this example of driving, the high-side voltage Vdd of the selection pulse SEL and the reset voltage Vrsth of the FD section 26 have a same potential.

As shown in FIG. 16, in a batch reset period, while the reset pulse RST is active, the drain voltage VRD of the reset transistor 23 is changed from the voltage Vrst1, which is lower than the depletion potential Vdep, to the voltage Vrsth, which is lower than the depletion potential Vdep.

After that, there is a batch exposure (global exposure) period, in which photoelectric conversion is performed on all the pixels in a same exposure period. Then, the driving is performed so that the signal charges of the photodiodes 21 of all the pixels are batch transferred to the FD section 26. And the signal levels are read out, and then driving is performed to row-sequentially read out the reset levels. Before reading out the reset level, the reset driving of the FD section 26 by the reset pulse RST.

In this manner, in the method of driving according to the first embodiment, it is assumed that the reset level is read out after the signal level is read out. In using this method of driving, by employing a structure in which at least a part of the reset transistor 23 side of the FD section 26 has a low impurity concentration in order to deplete the reset transistor 23 side of the FD section 26 in the pixel structure of the pixel 20A, it is possible to reduce random noise at reset time and unevenness on the screen. Furthermore, while the reset transistor 23 is on, the drain voltage VRD of the reset transistor 23 is changed from the voltage Vrst1 (<Vdep) to the voltage Vrsth (>Vdep) so that it is possible to reduce image-quality deterioration caused by a residual-image phenomenon at the time of the reset operation.

In this regard, the configuration of using the drain drive line 174 and the pixel drive line 17 in common is not limited to the pixel structure according to the reference examples 1 and 2. For example, it is possible to employ a pixel structure in which the above-described transfer transistor 22 is omitted, and electric charge is directly stored in the FD section 26.

3. Second Embodiment

Incidentally, the total load of the drive circuit is different in the case of batch pixel driving and the row-sequentially pixel driving, and thus a rise time and a fall time of the signal transition of the reset pulse RST are different because of a fall of the power-source voltage, etc. This means that the active period of the reset pulse RST is different in the case of batch pixel driving and in the case of row-sequential pixel driving.

Figure 29:
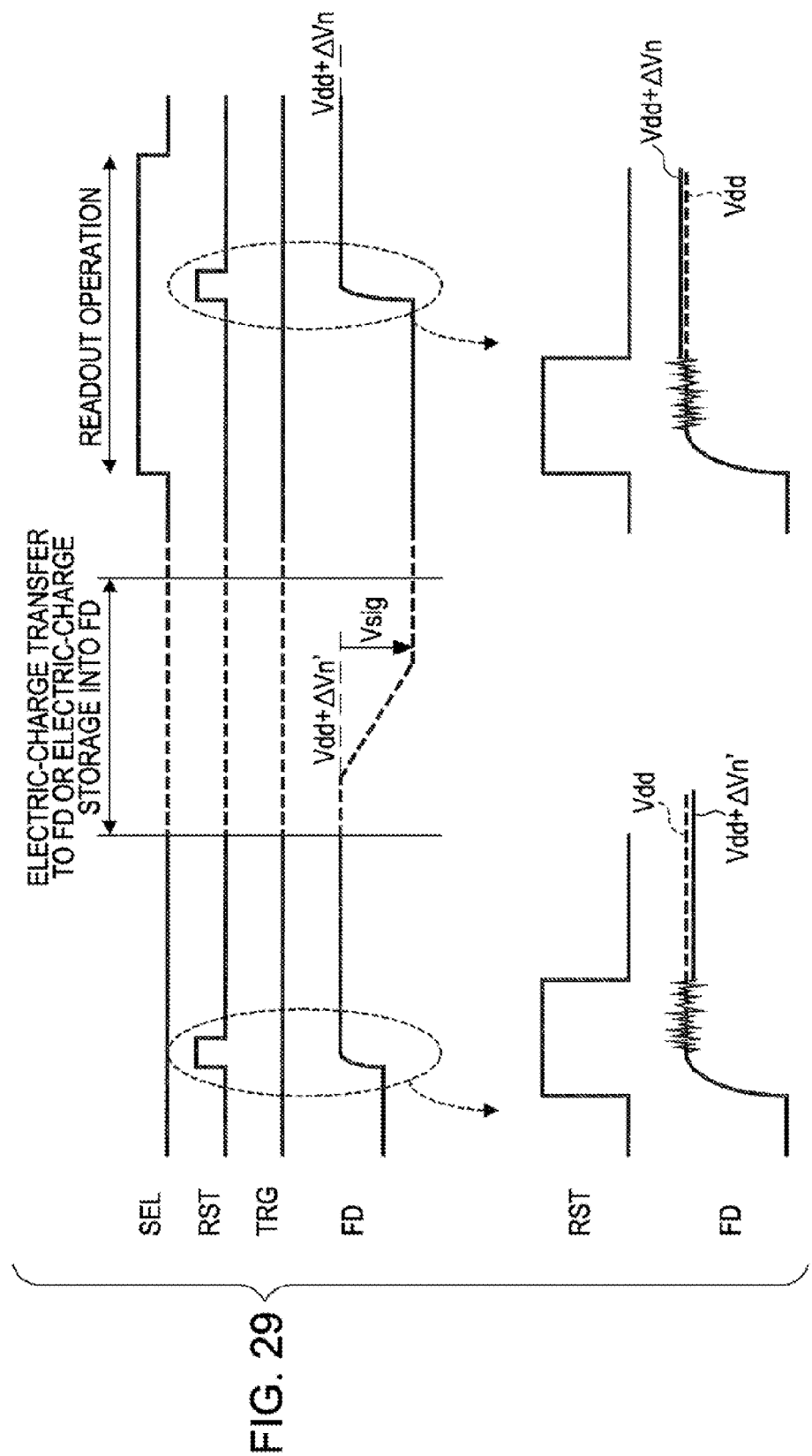
FIG. 29 is a timing chart illustrating order of driving in the case where a signal charge is read out from a state held by an FD section, or a signal charge is stored in the FD section.

Here, in the timing chart in FIG. 29, the reset pulse RST in the case of batch pixel driving is a pulse in a first half, that is to say, the reset pulse for initialization before batch transfer. Also, the reset pulse RST in the case of row-sequential pixel driving is a pulse in a last half, that is to say, the reset pulse for re-initialization performed in a readout period. As described above, the timing chart in FIG. 29 show sequence of driving in the case of reading out the signal charge held in the FD section 26, or the case of storing the signal charge in the FD section 26.

In this manner, if the reset pulse RST has a different active period, when the convergence of the FD voltage is in a transient state, the FD voltage at the time the reset pulse RST is inactive is different in the case of batch pixel driving and in the case of row-sequential pixel driving. The difference in the FD voltage is the difference in the reset level, and becomes an output offset (noise).

Thus, in a second embodiment, a driving method shown by a timing chart in FIG. 17 is employed. Specifically, in a batch exposure operation performing photoelectric conversion on all the pixels in a same exposure period, before the signal charge is transferred to the FD section 26 and is held, in the initialization operation of the FD section 26, the driving is performed not by batch driving on all the pixels, but by row-sequential scanning driving. That is to say, in a batch exposure operation, row-sequential initialization (reset) driving is performed on the FD section 26 before the signal charge is batch transferred to the FD section 26.

By employing such a method of driving, it is possible to increase the correlation between an active period of the reset pulse RST of the FD section 26 before electric-charge transfer and an active period of the reset pulse RST in the readout period. That is to say, it is possible to suppress a difference in individual active periods of the reset pulse RST for initialization before batch transfer and the reset pulse RST for re-initialization performed in the readout period. Thereby, it is possible to eliminate a difference in the FD voltage caused by the difference in the active periods of the reset pulses RST, and thus it is possible to reduce image-quality deterioration caused by an output offset caused by a difference in the FD voltages (the reset-level display).

At this time, a time interval of supplying the row-sequentially reset pulses RST may be equal to a readout interval. Note that it is not necessary to perform a readout operation of signals in a batch exposure period, and thus it is possible to perform high-speed scanning in a shorter time interval. Also, if a plurality of rows are driven at that time, higher correlation can be obtained than batch driving, and thus noise reduction effect can be obtained.

In this regard, FIG. 18 illustrates a general example of driving in batch exposure operation. In the general example of driving, the FD section 26 is batch reset before batch exposure, and after batch transfer, the signal level is read out by row-sequential scanning row-sequential scanning and the reset level is read out by resetting again. On the other hand, in the method of driving according to second embodiment, as is apparent from the timing chart in FIG. 17, driving is performed to reset only the FD section 26 by row-sequential scanning during a batch exposure period.

The method of driving according to the second embodiment can be applied to a pixel structure according to the first embodiment. That is to say, the method can be applied to a pixel structure in which at least the impurity concentration of a part of the reset transistor 23 side of the FD section 26 is made low so that the reset transistor 23 side of the FD section 26 is depleted. Note that the method is not limited to be applied to a pixel structure according to the first embodiment. It is possible to apply the method to a pixel structure in which the reset transistor 23 side of the FD section 26 is not depleted.

FIG. 19 illustrates an example of driving in the case where a driving method according to the second embodiment is applied to the pixel structure according to the first embodiment. In this example of driving, a high-side voltage Vdd of the selection pulse SEL and the reset voltage Vrsth of the FD section 26 have a same potential.

In this case, in a batch exposure period, while the reset pulse RST is active, the drain voltage VRD of the reset transistor 23 is changed from the voltage Vrst1, which is lower than the depletion potential Vdep, to the voltage Vrsth, which is higher than the depletion potential Vdep.

In this regard, in a method of driving according to this embodiment, the FD section 26 is reset by row-sequential scanning during a batch exposure period. However, a plurality of pixel rows, namely two rows or more is regarded as one unit, and the reset operation of the FD section 26 may be performed by sequential scanning for each unit. Thereby, it is possible to complete the reset operation of the FD section 26 at a higher speed. However, it is preferable to perform row-sequential scanning for each row in the same manner as the readout operation because it is easy to correlate an active period of the reset pulse RST of the FD section 26 before an electric charge transfer with an active period of the reset pulse RST in a readout period.

4. The Other Pixel Structure Examples

The present invention can be applied to various kinds of pixel structures described below in addition to the pixel structures according to the above-described reference examples 1 and 2.

Pixel Structure Example 1

As shown in FIG. 6, in general, in order to connect the contact section 27 for reading out the voltage of a region of the FD section 26, the connection section is formed by contact section 27 so as not to be depleted. In the case excluding such a case, not only the reset transistor 23 side, but also the other regions may be depleted.

Figure 20A:
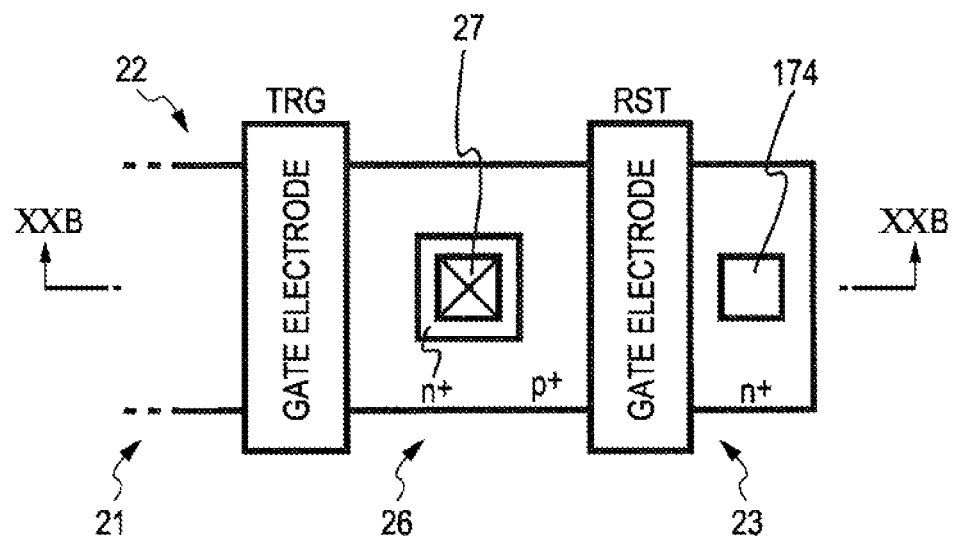
FIGS. 20A and 20B are diagrams illustrating a pixel structure according to a pixel structure example 1.
Figure 20B:
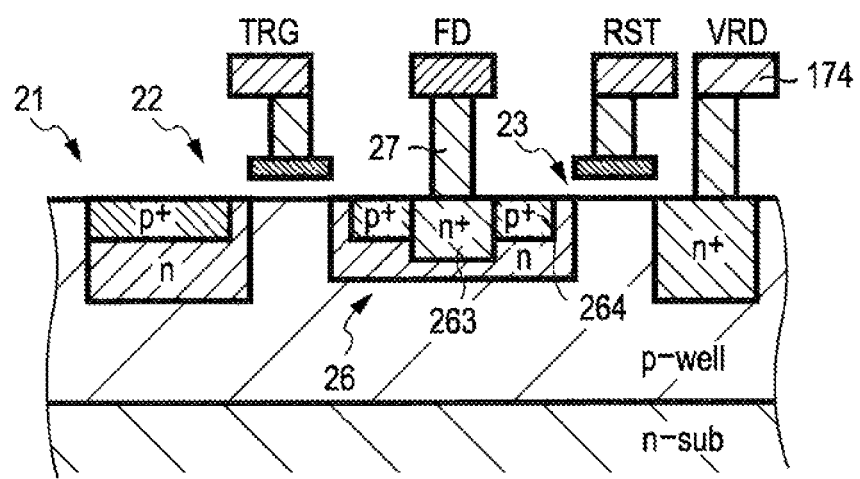

For example, as shown in FIG. 20, the substrate surface other than an $n^+$ impurity diffusion region 263 to which the contact 27 is connected in the FD section 26 may be covered by a $p^+$ impurity-diffusion region 264. FIG. 20A is a plan view of a surrounding area of the FD section, and FIG. 20B is a sectional view taken along line XXB-XXB of FIG. 20A.

By the pixel structure example 1, the $n^+$ impurity-diffusion region 263 is covered with the $p^+$ impurity diffusion region 264 in a wider range, and thus dark current can be reduced. And it is possible to apply the above-described first or second embodiment to the pixel structure according to the pixel structure example 1.

Pixel Structure Example 2

The above-described first embodiment can be applied to a pixel structure reading out the voltage of the FD section using capacitance coupling (for example, refer to Japanese Unexamined Patent Application Publication Nos. 2004-015291 and 2005-184479, etc.) depending on the conditions. That is to say, if at least the reset transistor side of the FD section is depleted, the first embodiment can be applied. In this regard, the above-described second embodiment can be applied even if at least reset transistor side of the FD section is not depleted.

Figure 21A:
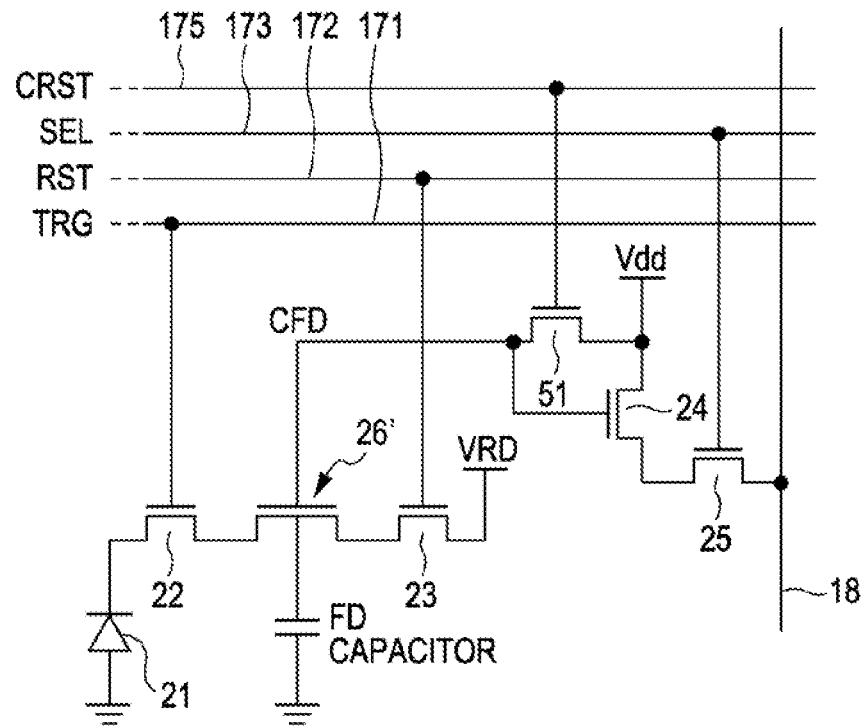
FIGS. 21A and 21B are diagrams illustrating a pixel structure according to a pixel structure example 2.
Figure 21B:
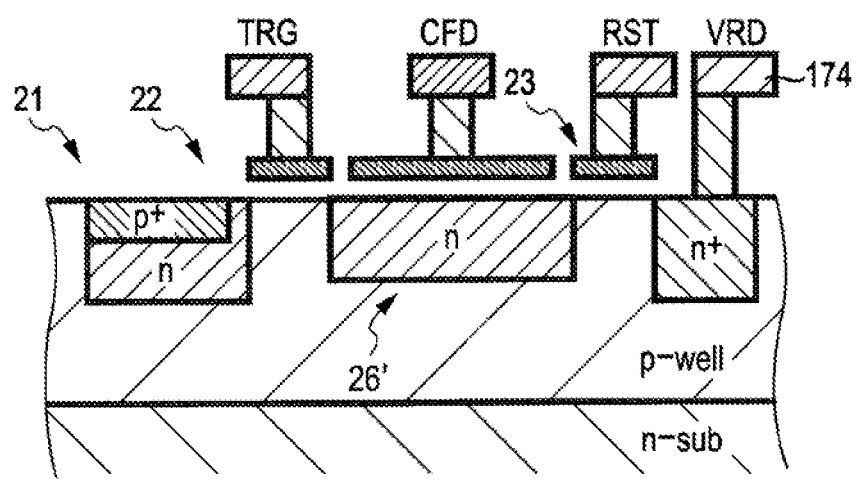

FIGS. 21A and 21B are diagrams illustrating a pixel structure for reading out a voltage of the FD section using capacitance coupling, that is to say, a pixel structure according to the pixel structure example 2, FIG. 21A is a circuit diagram of a pixel, and FIG. 21B is a sectional view of the pixel structure.

As shown in FIG. 21A, a pixel 20B according to the pixel structure example 2 has a second reset transistor 51 connected between the gate electrode of an FD section 26' and a power source Vdd. The second reset transistor 51 becomes an on state in response to a reset signal CRST given to the gate electrode through a second reset line 175 so that the gate voltage of the FD section 26' is reset to the power source Vdd.

In FIG. 21B, the FD section 26' as an electric-charge holding section is formed by an n impurity-diffusion region. The impurity concentration is adjusted such that at least the reset transistor 23 side of the n impurity-diffusion region becomes a depletion state. The gate voltage of the FD section 26' is reset to the power source Vdd in advance by the reset signal CRST.

And when a signal charge is transferred from the photodiode 21 to the FD section 26' through the transfer transistor 22, the gate voltage of the FD section 26' is changed by being modulated by the amount of the signal charge by capacitance coupling of the gate capacitance formed between the n impurity-diffusion region and the gate electrode. The gate electrode of the FD section 26' is connected to the gate electrode of the amplification transistor 24. Accordingly, the gate voltage of the FD section 26' can be read on the vertical signal line 18 through the amplification transistor 24 and the selection transistor 25.

In this manner, the above-described first or second embodiment can also be applied to a pixel structure according to the pixel structure example 2 in which the voltage of the FD section 26' is read out using capacitance coupling as long as at least reset transistor 23 side of the FD section 26' is depleted. The second embodiment can be applied even if at least reset transistor side of the FD section 26' is not depleted.

Pixel Structure Example 3

The above-described first or second embodiment can also be applied to a pixel structure having a memory section temporarily holding electric charges (for example, refer to Japanese Unexamined Patent Application Publication Nos. 11-177076 and 2006-311515, Japanese Patent Application No. 2008-096884 specification, etc.).

Figure 22:
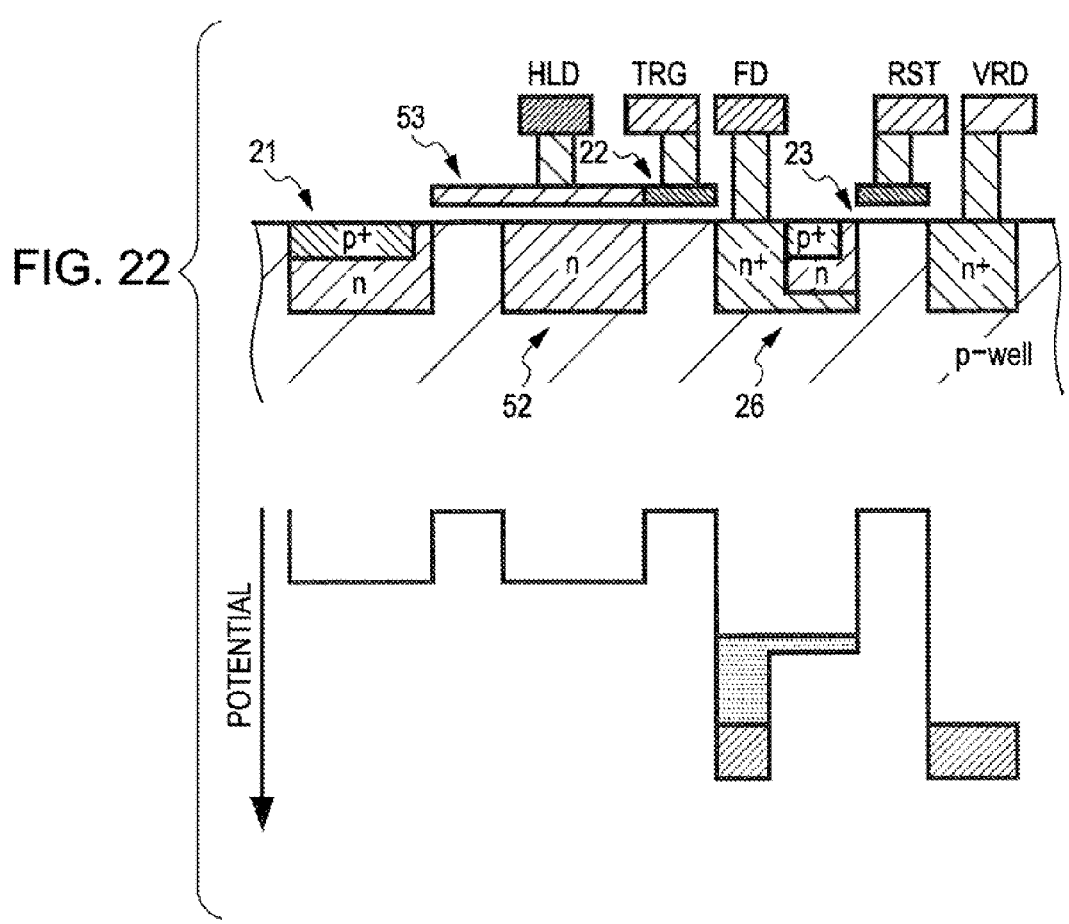
FIG. 22 is a diagram illustrating a pixel structure and a potential distribution according to a pixel structure example 3.

As an example, FIG. 22 illustrates a pixel structure having a memory section, that is to say, a pixel structure according to a pixel structure example 3. The pixel structure has a memory section 52 formed by an n impurity-diffusion region between the photodiode 21 and the FD section 26, and a transfer gate 53 transferring an electric charge from the photodiode 21 to the memory section 52. The transfer gate 53 is formed over the entire surface of the memory section 52.

In this pixel structure, the electric charge stored in the photodiode 21 at the time of exposure completion is transferred to the memory section 52 by the transfer gate 53 being driven by a signal HLD, and is temporarily held in the memory section 52. The readout of the held electric charge is carried out by the transfer transistor 22 transferring to the FD section 26 in the same manner as the case of the pixel structure not having the memory section 52.

The above-described first or second embodiment can also be applied to a pixel structure according to the pixel structure example 3 having such a configuration. In particular, a pixel structure proposed in Japanese Patent Application No. 2008-096884 specification employs a configuration storing electric charges in both the memory section 52 and the FD section 26. Specifically, among the electric charges transferred from the photodiode 21 to the memory section 52, the electric charges overflowed from the memory section 52 are stored in the FD section 26, and the remainder (not overflowed portion) is held in the memory section 52.

In this manner, in the pixel structure using a structure storing electric charges in both the memory section 52 and the FD section 26, batch transfer transferring the electric charge held in the memory section 52 to the FD section 26 in a batch mode is performed. Accordingly, in a pixel structure having a memory section 52 temporarily holding an electric charge in addition to the FD section 26, and in particular, when batch transfer of an electric charge is performed from the memory section 52 to the FD section 26, it is advantageous to apply the above-described first or second embodiment.

Pixel Structure Example 4

The light receiving section (photoelectric conversion element) performing photoelectric conversion is not limited to a pixel structure formed by a silicon (Si). For example, the above-described first or second embodiment can also be applied to a pixel structure using an organic photoelectric conversion layer (for example, refer to Japanese Unexamined Patent Application Publication Nos. 2007-208840 and 2008-228265, etc.). In a structure using an organic photoelectric conversion layer, complete transfer of an electric charge often fails to be achieved in the same manner as shown in the case of an embedded photodiode in a silicon. Thus, it is advantageous to apply the above-described first or second embodiment.

Figure 23A:
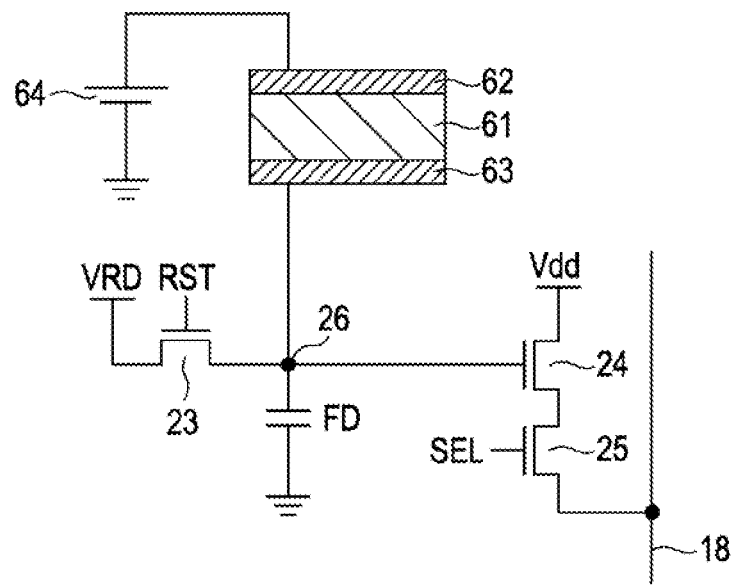
FIGS. 23A and 23B are diagrams illustrating a pixel structure according to a pixel structure example 4.
Figure 23B:
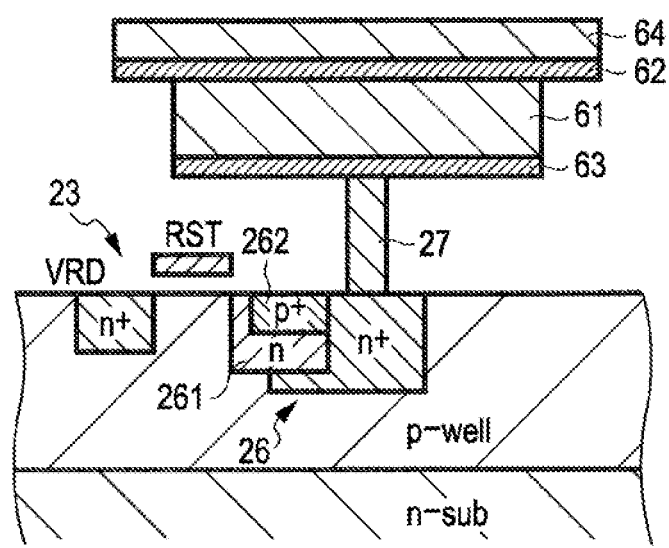

FIGS. 23A and 23B are diagrams illustrating a pixel structure using an organic photoelectric conversion layer, that is to say, a pixel structure according to a pixel structure example 4. FIG. 23A is a circuit diagram, and FIG. 23B is a sectional view. In FIGS. 23A and 23B, a same reference numeral is given to a same part as that in FIG. 2, and an overlapping explanation will be omitted.

A photoelectric conversion layer 61 is sandwiched by an upper electrode 62 and a lower electrode 63. At least the lower electrode 63 is divided into pixels, and a highly transparent electrode is often used for that electrode. A protection layer 64 is disposed on the upper electrode 62. And a bias voltage is applied on the upper electrode 62 by a bias power source 64.

The electric charge generated by photoelectric conversion by the photoelectric conversion layer 61 is stored in the FD section 26. The electric charge of the FD section 26 is read out from the vertical signal line 18 through a readout circuit including the amplification transistor 24 as a voltage. The FD section 26 is reset by the reset transistor 23. And the drain voltage VRD of the reset transistor 23 is allowed to be changed from the voltage Vrst1 having a lower potential than the depleted reset transistor 23 side of the FD section 26 to the voltage Vrsth having a higher potential.

As shown in FIG. 23B, at least the reset transistor 23 side of the FD section 26 can be depleted. Specifically, in the FD section 26 including the n$^+$ impurity-diffusion region, a part of the reset transistor 23 side is formed to be n impurity-diffusion region 261, and the p$^+$ impurity-diffusion region 262 is formed on a surface layer other than an area to which a contact section 27 is connected in the pixel structure.

Figure 24:
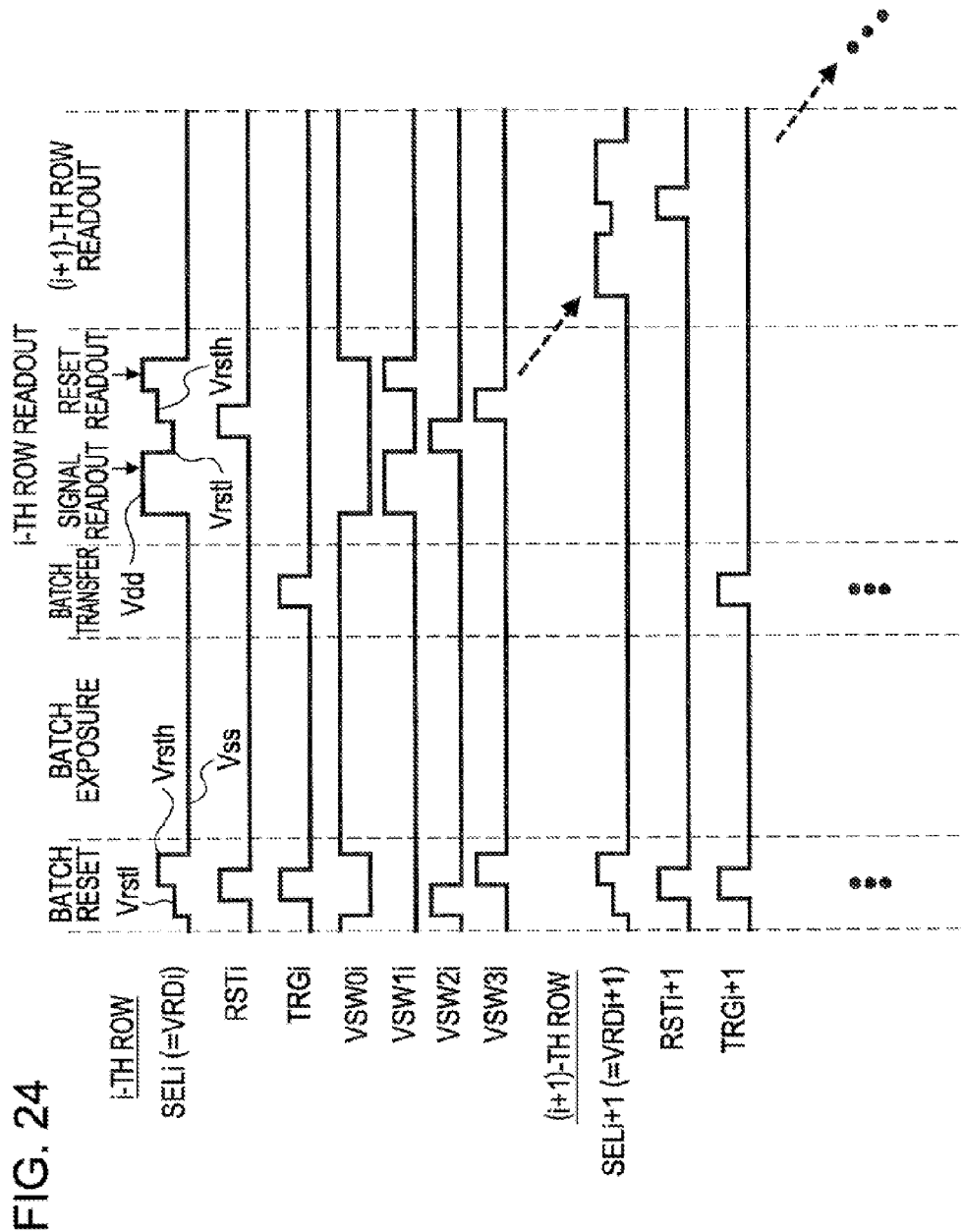
FIG. 24 is a timing chart for explaining an example of driving in the case where the above-described first embodiment is applied to the pixel structure according to the pixel structure example 4.

FIG. 24 is a timing chart for explaining an example of driving in the case where the above-described first embodiment is applied to the pixel structure according to the pixel structure example 4.

In FIG. 16, which illustrates an example of driving in the case of an circuit example of the pixel 20A, shown in FIG. 13, according to the first embodiment, the voltage Vrsth and the power-source voltage Vdd have a same potential, and the voltage Vrst1 and the power-source voltage Vss have a same potential. In contrast, in FIG. 24 illustrating the example of this driving, the case in which Vrsth≠Vdd, Vrst1≠Vss is shown.

In FIG. 24, VSW0$i$, VSW1$i$, VSW2$i$, and VSW3$i$ are signals driving the switch transistors SW11, SW12, SW21, and SW22 of the drive circuit 133 shown in FIG. 15. That is to say, by the driving of the drive signals VSW0$i$, VSW1$i$, VSW2$i$, and VSW3$i$, the drive circuit 133 outputs the selection pulse SEL of the amplitude Vss–Vdd, and alternatively outputs the voltage Vrst1 or the voltage Vrsth.

As described before, if the voltage Vrsth and the power-source voltage Vdd have a same potential, and the voltage Vrst1 and the power-source voltage Vss have a same potential, it becomes unnecessary to have the drive signals VSW2$i$ and VSW3$i$ for alternatively selecting the voltage Vrst1 and the voltage Vrsth. Thereby, the CMOS inverter INV2 in the drive circuit 133 shown in FIG. 15 can be reduced, and thus it is possible to simplify the drive circuit 133, and also the row scanning section 13.

Pixel Structure Example 5

As described above, the above-described first or second embodiment can be applied to a pixel structure having a discharge gate of an electric charge separately from the transfer transistor 22 for an electric-charge discharge operation of the light receiving section.

Figure 25:
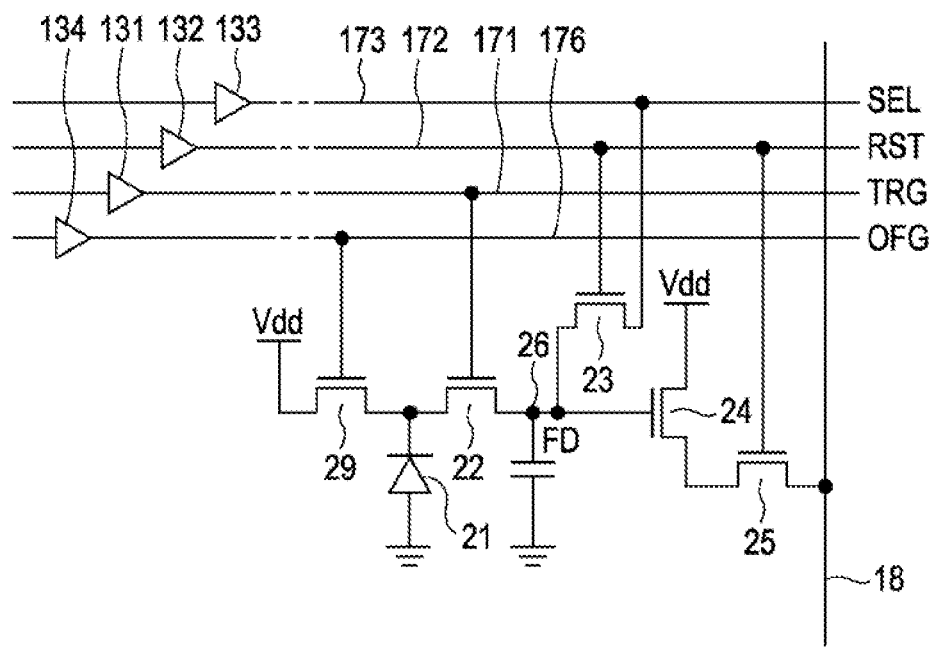
FIG. 25 is a circuit diagram illustrating a circuit configuration of a pixel structure according to a pixel structure example 5.

FIG. 25 is a circuit diagram illustrating a circuit configuration of a pixel structure according to a pixel structure having an electric-charge discharge gate, that is to say, a pixel structure example 5. In FIG. 25, a same reference numeral is given to a same part as that in FIG. 13, and an overlapping explanation will be omitted.

As shown in FIG. 25, an electric-charge discharge gate 29 is connected between the cathode electrode of the photodiode 21 and the power source Vdd. A discharge control signal OFG is given from the drive circuit 134 to the control electrode of the discharge gate 29 through a control line 176.

In this manner, in the case of a pixel structure having the discharge gate 29, it is possible to discharge electric charges of the photodiode 21 without passing through the transfer transistor 22 and the reset transistor 23. Thus, the reset by row-sequential scanning of the FD section 26 is not subject to the timing restriction of a batch reset operation.

For example, in FIG. 19 illustrating the example of driving the pixel 20A shown in FIG. 13, it is necessary to start the reset operation of the FD section 26 by row-sequential scanning after the batch reset, and to complete the reset operation before batch transfer.

Figure 26:
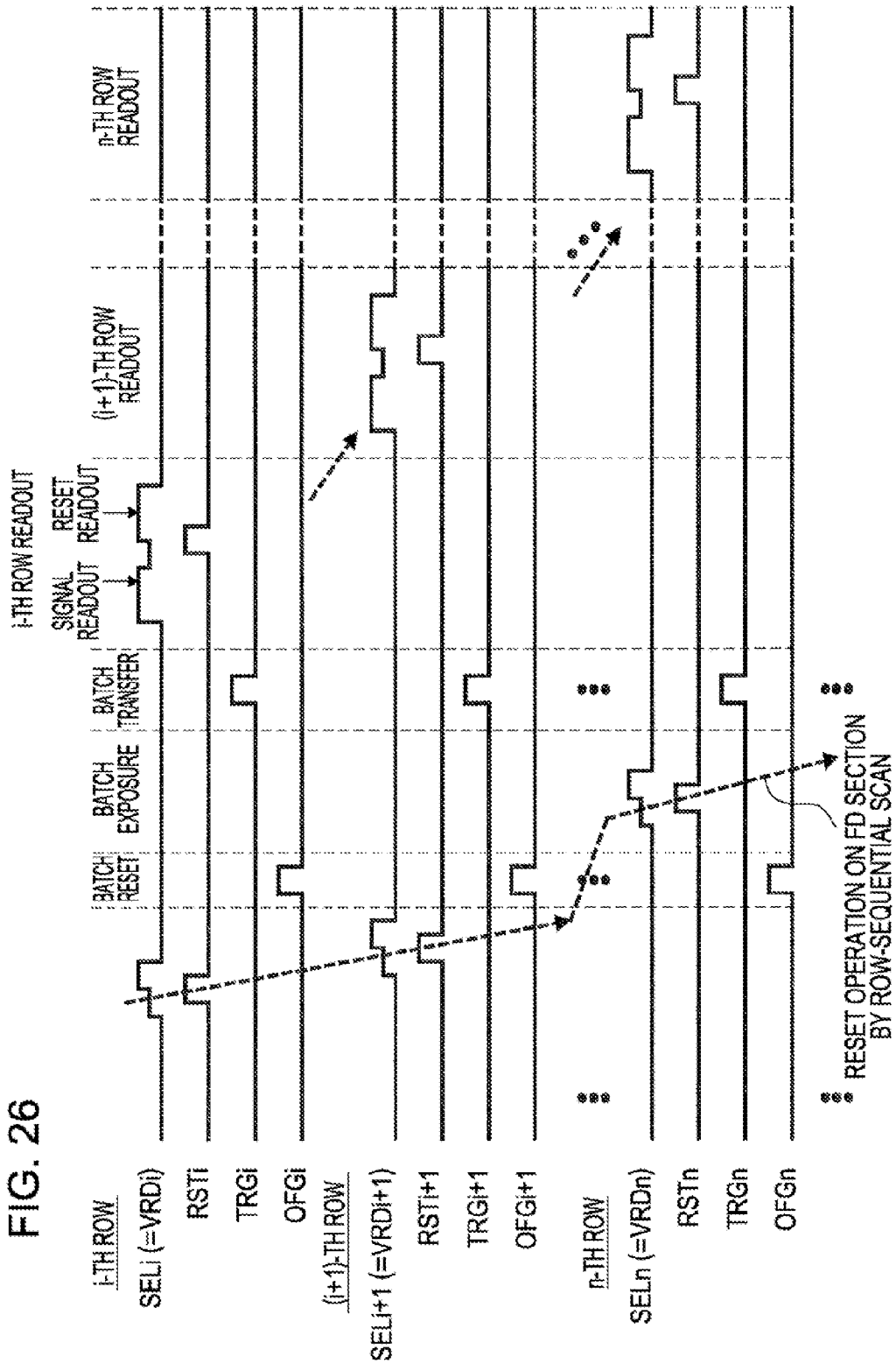
FIG. 26 is a timing chart for explaining an example of driving of a pixel structure according to the pixel structure example 5.

In contrast, in the case of a pixel structure having the discharge gate 29, as shown by an example of driving shown in FIG. 26, it is possible to perform a batch reset operation discharging the stored charges of the photodiode 21 in a batch for all the pixels using the discharge gate 29 during the reset operation of the FD section 26 by row-sequential scanning. That is to say, for the reset operation of the FD section 26 by row-sequential scanning, the reset operation for each pixel row may be completed with extending in time over the batch reset operation (electric-charge discharge operation) of all the pixels as long as the reset operation is before the batch transfer. Accordingly, the timing of the batch reset operation is not restricted.

5. Variation

In the above-described embodiments, descriptions have been given of the case where the present invention is applied to a CMOS image sensor as an example. The CMOS image sensor includes a plurality of unit pixels, each of which detects a signal charge in accordance with an amount of visible light as a physical quantity, arranged in a two-dimensional matrix. However, the present invention is not limited to this example. That is to say, the present invention can be generally applied to an X-Y addressing solid-state imaging device that performs driving to read out a reset level after reading out a signal level.

Also, the present invention is applied not only to a solid-state imaging device detecting a distribution of an amount of incident visible light and capturing it as an image. The present invention can also be applied to a solid-state imaging device capturing a distribution of an amount of incoming infrared rays, X-rays, particles, etc. Further, in a broad sense, solid-state imaging devices sometimes include a physical-quantity distribution detection apparatus which detects a distribution of the other physical-quantity, such as a pressure, an electrostatic capacitance, and captures it as an image, such as a fingerprint detection sensor, etc.

In this regard, a solid-state imaging device may be formed as one chip, or may be formed in a module state having an imaging function as a package integrating an imaging section and a signal processing section or an optical system.

6. Electronic Systems

The present invention is not limited to a solid-state imaging device, and can be generally applied to an electronic system using a solid-state imaging device as an image capturing section (photoelectric conversion section). For example, the electronic systems include an imaging apparatus, such as a digital still camera, a video camera, etc., a mobile terminal apparatus having an imaging function, such as a cellular phone, etc., a copying machine using a solid-state imaging device for image capturing section, etc. In this regard, the above-described module that is mounted on an electronic system, that is to say, a camera module is sometimes regarded as an imaging apparatus.

Imaging Apparatus

Figure 27:
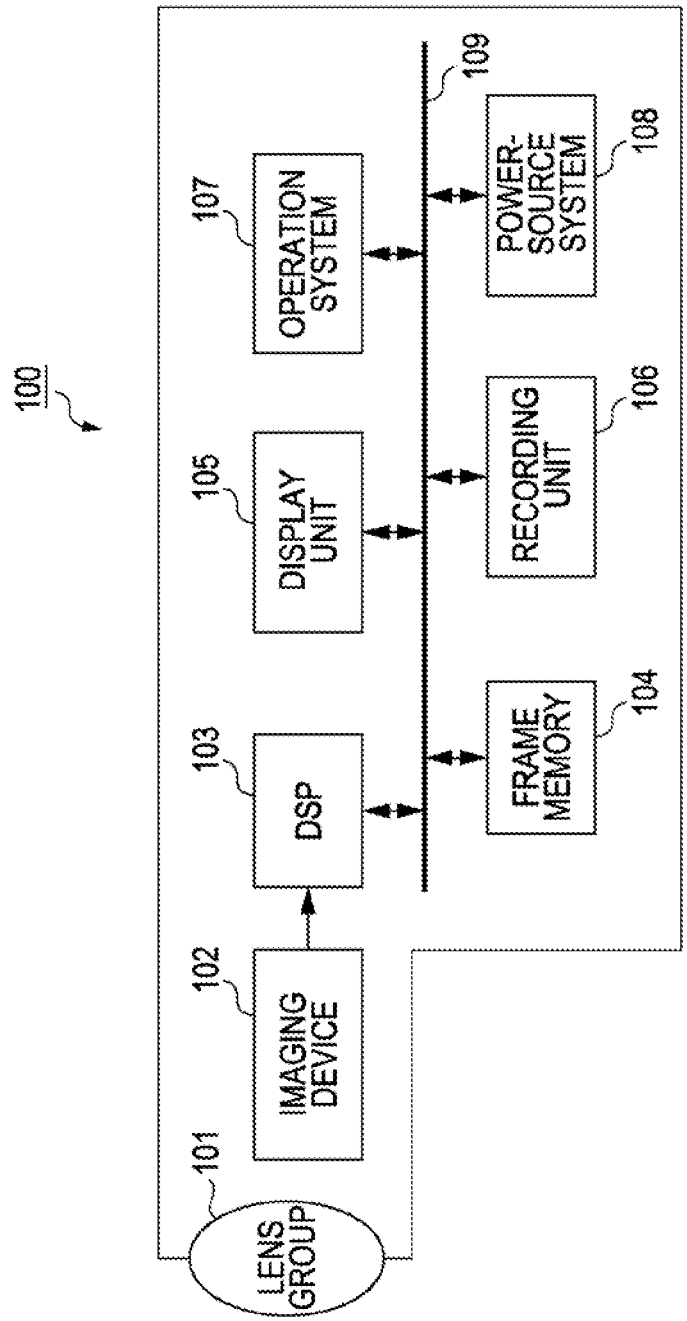
FIG. 27 is a block diagram illustrating an example of a configuration of an imaging apparatus according to the present invention.
Figure 28:
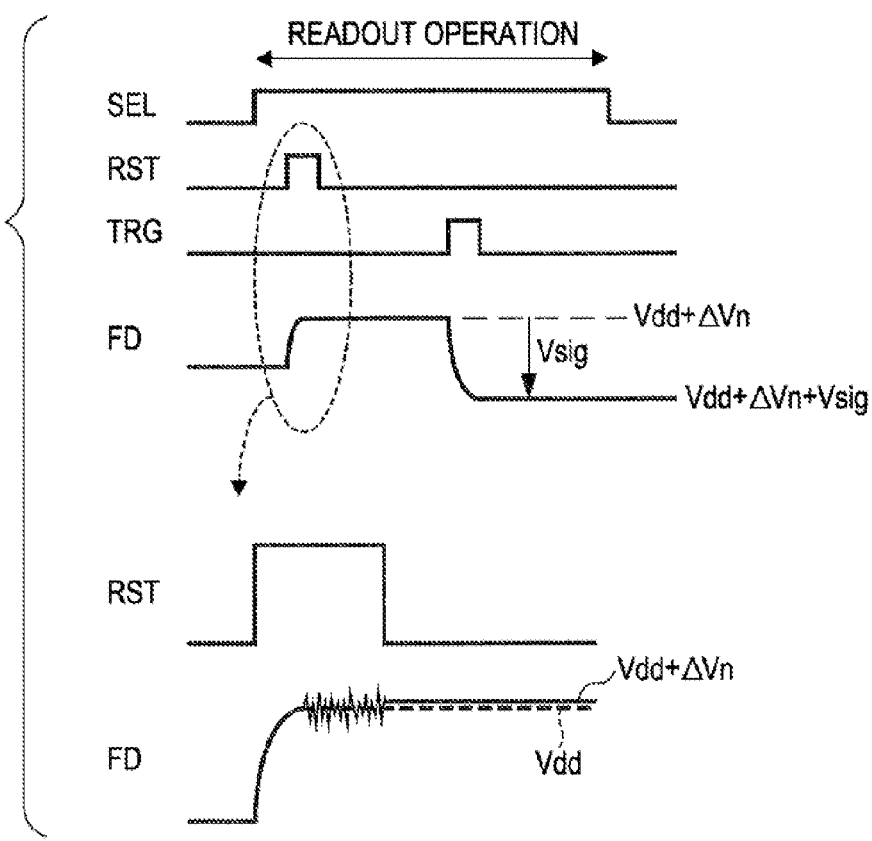
FIG. 28 is a timing waveform chart in the case of an example of driving in which noise is eliminated by correlated double sampling.

FIG. 27 is a block diagram illustrating an example of a configuration of an imaging apparatus, which is an example of an electronic system according to the present invention. As shown in FIG. 27, an imaging apparatus 100 according to the present invention includes an optical system including a lens group 101, etc., an imaging device 102, a DSP circuit 103, which is a camera-signal processing section, a frame memory 104, a display unit 105, a recording unit 106, an operation system 107 and power-source system 108, etc. And imaging apparatus 100 has a configuration in which the DSP circuit 103, the frame memory 104, the display unit 105, the recording unit 106, the operation system 107 and the power-source system 108 are mutually connected through a bus line 109.

The lens group 101 takes in incident light (image light) from a subject, and forms an image on an image-capture surface of the imaging device 102. The imaging device 102 converts the amount of incident light of the image formed by the lens group 101 on the image-capture surface into an electronic signal for each pixel, and outputs a pixel signal. For the imaging device 102, CMOS image sensors according to the above-described first to fifth embodiments or application examples are used.

The display unit 105 includes a panel display apparatus, such as a liquid-crystal display apparatus, an organic EL (Electro Luminescence) display apparatus, etc., and displays a moving image or a still image captured by the imaging device. The recording unit 106 records a moving image or a still image captured by the imaging device 102 onto a recording medium, such as a video tape or a DVD (Digital Versatile Disk), etc.

The operation system 107 issues an operation command on various functions possessed by the imaging apparatus under the user's operation. The power-source system 108 suitably supplies various kinds of power sources to be operating power sources of the DSP circuit 103, the frame memory 104, the display unit 105, the recording unit 106, and the operation system 107.

Such an imaging apparatus 100 is applied to a camera module for a mobile apparatus, such as a video camera, a digital still camera, and further, a cellular phone, etc. And in the imaging apparatus 100, a CMOS image sensor according to the above-described first or second embodiment can be used as an imaging device 102. By a CMOS image sensor according to the embodiments, it is possible to reduce random noise at reset time and surface unevenness, and to reduce image-quality deterioration at reset operation time. Thereby it is possible to obtain an imaging pixel with a higher image quality.

The present application contains subject matter related to that disclosed in Japanese Priority Patent Application JP 2009-135666 filed in the Japan Patent Office on Jun. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising at least one pixel, the pixel including:
   (a) a photoelectric converter;
   (b) a floating diffusion region with an impurity diffusion region and a sub-region at least partially within the impurity diffusion region, both of which are of the same conductivity type but the sub-region having an impurity concentration lower than that of impurity-diffusion region and enabled to achieve a depletion state; and
   (c) a reset transistor configured to reset the floating diffusion region,
   wherein,
      the sub-region is located at a side of the impurity-diffusion region that is closest to the reset transistor,
      a surface of the floating diffusion section that includes a surface of the impurity-diffusion region and a surface of the sub-region.

2. The solid-state imaging device according to claim 1, wherein a part of a surface layer of the impurity-diffusion region is covered with and includes a second impurity-diffusion region having a reverse-conductivity type to the impurity-diffusion region.

3. The solid-state imaging device according to claim 1, wherein the pixel includes a transfer transistor configured to transfer electric charges generated by the photoelectric conversion section to the floating diffusion region.

4. The solid-state imaging device according to claim 1, wherein the pixel includes a discharge gate operable to discharge electric charges accumulated in the photoelectric conversion section.

5. The solid-state imaging device according to claim 1, wherein the pixel includes a memory section that can temporarily hold charges between the photoelectric conversion section and the impurity-diffusion region.

6. The solid-state imaging device according to claim 5, wherein the impurity-diffusion region is operable to hold charges overflowed from the memory section.

7. The solid-state imaging device according to claim 1, further comprising a voltage-supply coupled to the reset transistor, the voltage-supply providing different voltages to the reset transistor.

8. The solid-state imaging device according to claim 1, wherein the pixel includes a selection transistor operable to select the pixel for read out of a signal from the floating diffusion.

9. The solid-state imaging device of claim 1, configured to supply different voltages to the reset transistor to set the floating diffusion to different potential levels.

10. The solid-state imaging device of claim 1, further comprising drive circuitry configured to provide a first voltage lower than a depletion potential of the reset transistor side of the impurity-diffusion region to a second voltage higher than the depletion potential while the reset transistor is on.

* * * * *